(12) United States Patent
Popp et al.

(10) Patent No.: US 7,642,572 B2
(45) Date of Patent: Jan. 5, 2010

(54) INTEGRATED CIRCUIT HAVING A MEMORY CELL ARRAY AND METHOD OF FORMING AN INTEGRATED CIRCUIT

(75) Inventors: Martin Popp, Dresden (DE); Till Schloesser, Dresden (DE); Ulrike Gruening-von Schwerin, Munich (DE); Rolf Weis, Dresden (DE)

(73) Assignee: Qimonda AG, Munich (DE)

(*) Notice: Subject to any disclaimer, the term of this patent is extended or adjusted under 35 U.S.C. 154(b) by 0 days.

(21) Appl. No.: 11/735,164

(22) Filed: Apr. 13, 2007

(65) Prior Publication Data

US 2008/0253160 A1 Oct. 16, 2008

(51) Int. Cl.
*H01L 27/108* (2006.01)
(52) U.S. Cl. .................. 257/211; 257/202; 257/71; 257/E27.084; 365/72
(58) Field of Classification Search .............. 257/71, 257/202, 211, E27.084; 365/72
See application file for complete search history.

(56) References Cited

U.S. PATENT DOCUMENTS

| | | | | |
|---|---|---|---|---|
| 5,298,775 A | * | 3/1994 | Ohya | ................. 257/211 |
| 6,342,420 B1 | * | 1/2002 | Nishimura et al. | .......... 438/253 |
| 6,396,096 B1 | * | 5/2002 | Park et al. | ................. 257/296 |
| 6,617,205 B1 | | 9/2003 | Kimura et al. | |
| 6,992,343 B2 | * | 1/2006 | Miyatake et al. | ............ 257/296 |
| 7,045,834 B2 | | 5/2006 | Tran et al. | |
| 7,139,184 B2 | * | 11/2006 | Schloesser | ................. 365/53 |
| 7,183,603 B2 | * | 2/2007 | Park | ........................ 257/298 |
| 2008/0144347 A1 | * | 6/2008 | Takemura et al. | ............. 365/63 |

OTHER PUBLICATIONS

"A 6F2 DRAM Technology in 60nm era for Gigabit Densities", Changhyun Cho, et al., Advanced Technology Development Team, Memory Division, Device Solution Network, Samsung Electronics Co.

* cited by examiner

*Primary Examiner*—Victor A Mandala
(74) *Attorney, Agent, or Firm*—Dicke, Billig & Czaja, PLLC

(57) ABSTRACT

An integrated circuit having a memory cell array and a method of forming an integrated circuit is disclosed. One embodiment provides bitlines running along a first direction, wordlines running along a second direction substantially perpendicular to the first direction, active areas and bitline contacts. The bitline contacts are arranged in columns extending in the second direction and in rows extending in the first direction. A distance between neighboring bitlines is DL, and a distance between neighboring bitline contacts is DC, DC being measured parallel to the first direction. The following relation holds: $1/2.25 \leq DL/DC \leq 1/1.75$.

20 Claims, 22 Drawing Sheets

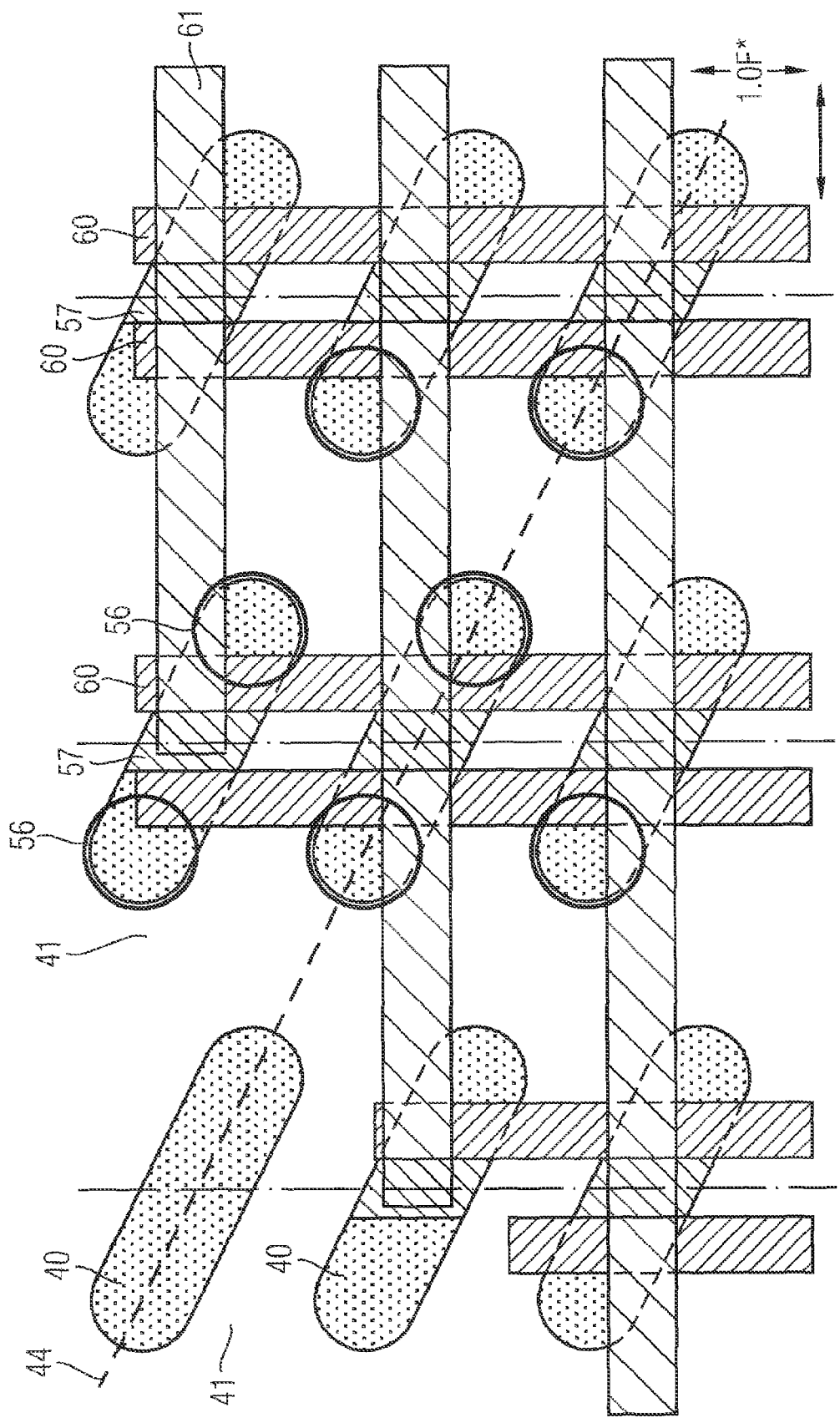

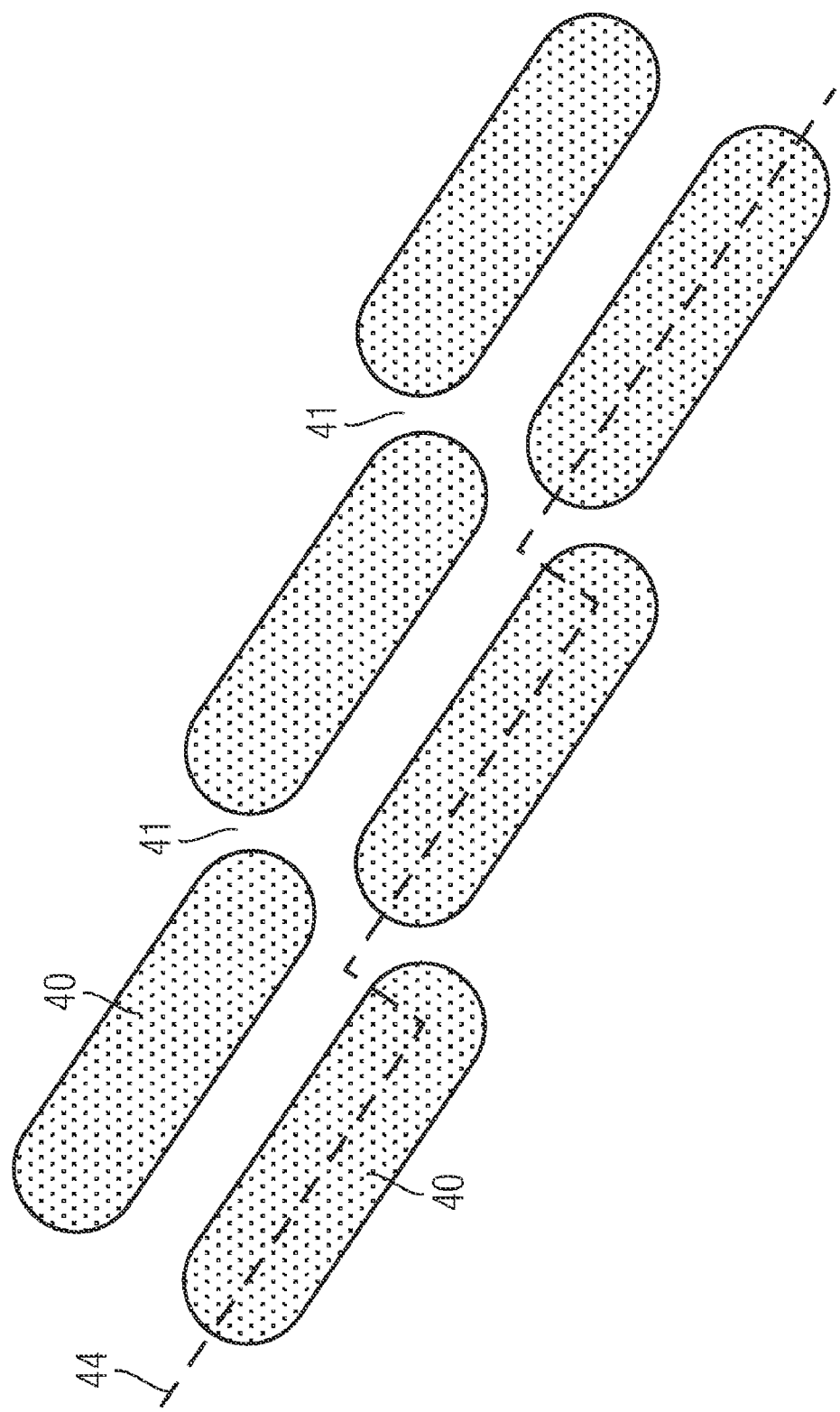

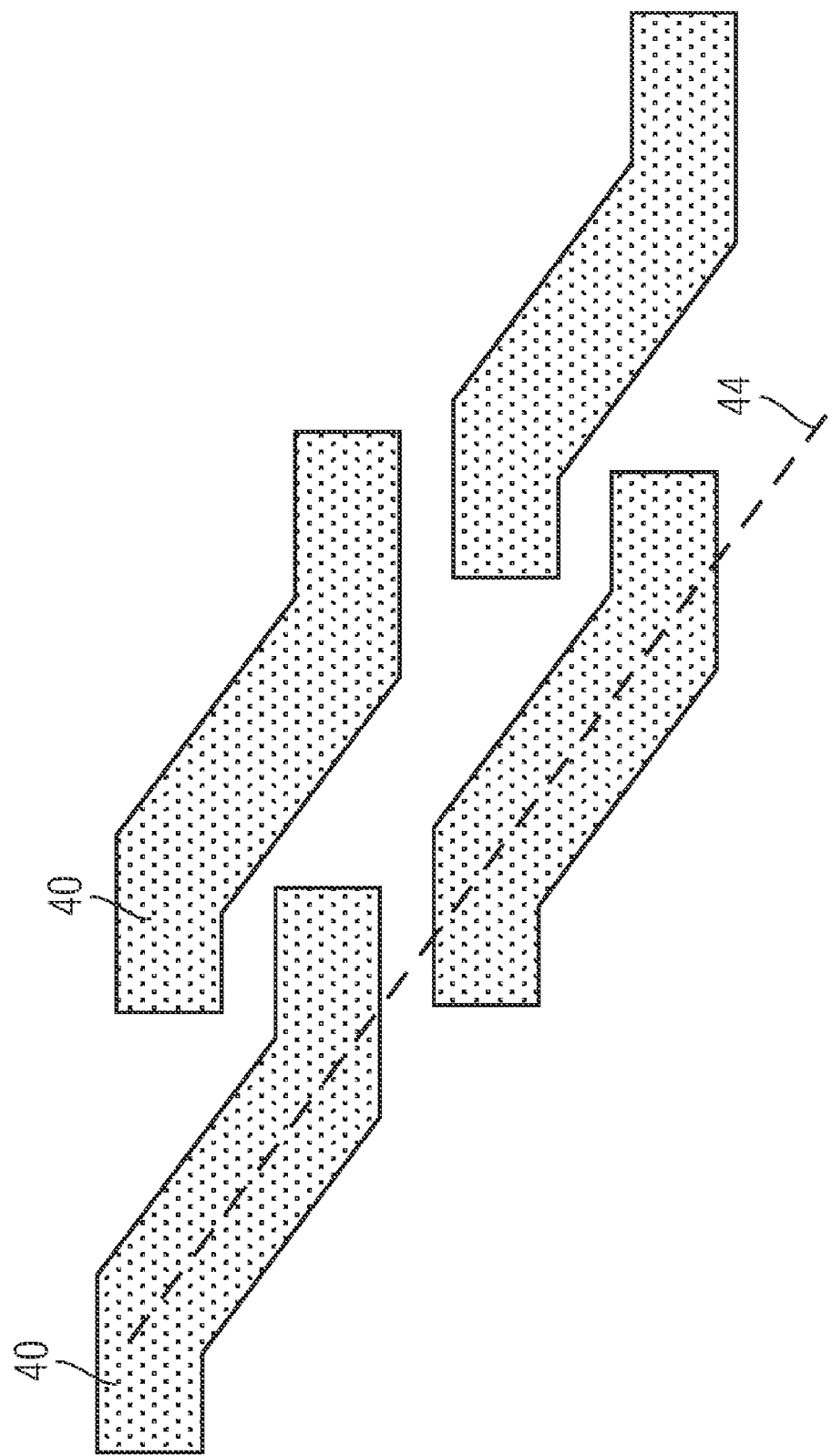

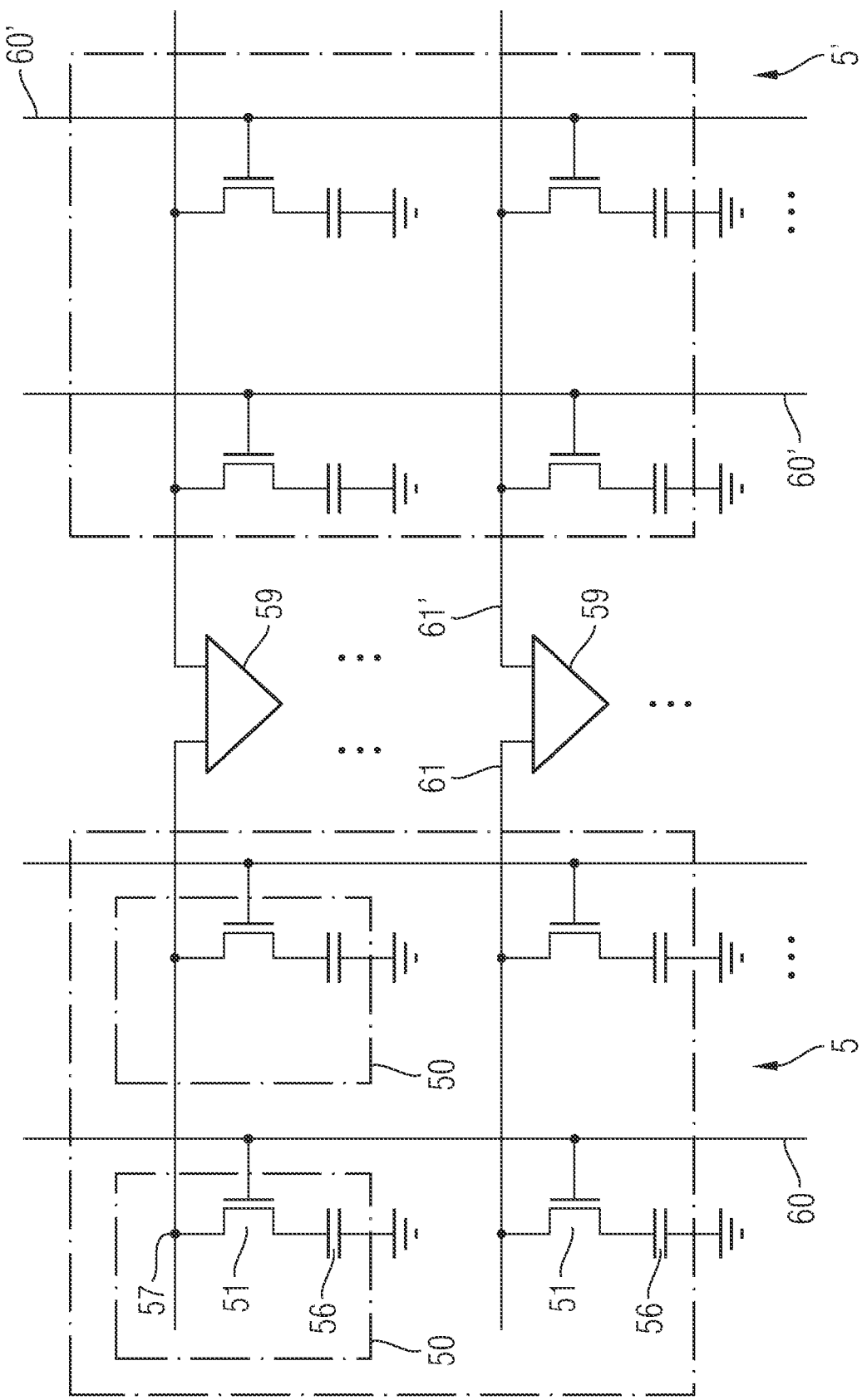

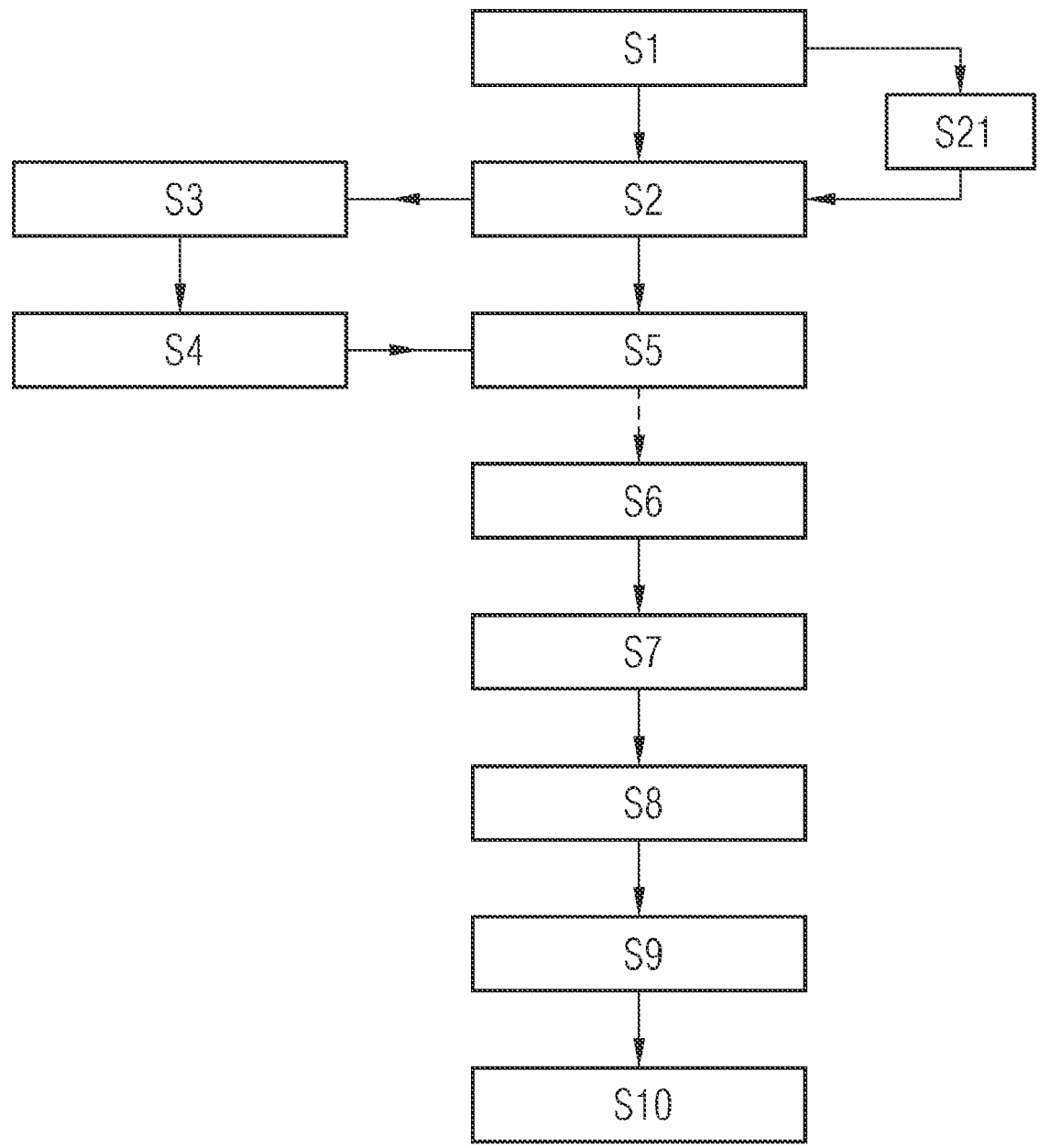

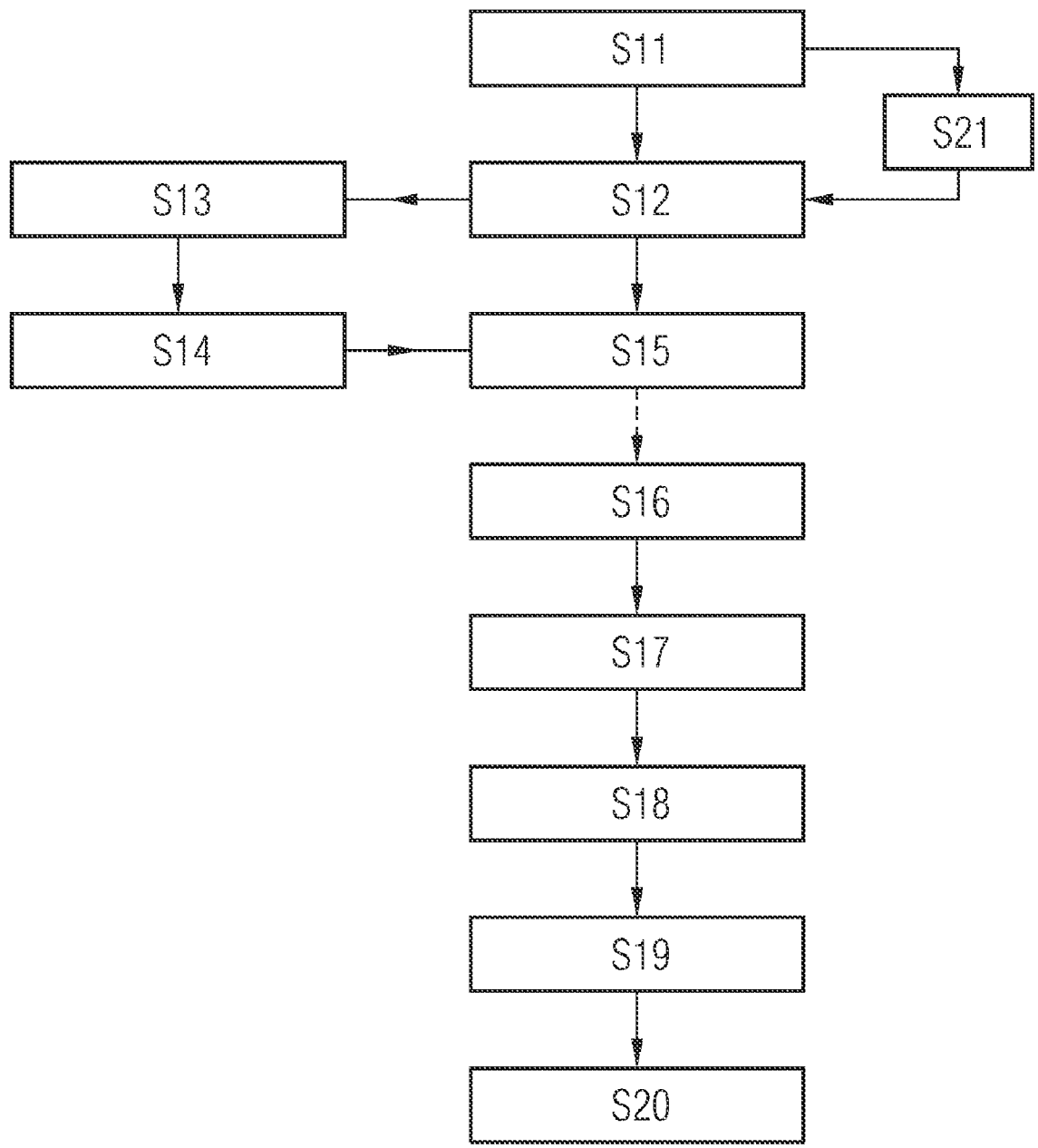

INTEGRATED CIRCUIT HAVING A MEMORY CELL ARRAY AND METHOD OF FORMING AN INTEGRATED CIRCUIT

BACKGROUND

The following description relates to an integrated circuit having a a memory cell array including a plurality of memory cells. Moreover, the description refers to a method of forming such an integrated circuit having a memory cell array.

Memory cells of a dynamic random access memory (DRAM) generally include a storage capacitor for storing an electrical charge which represents information to be stored and an access transistor connected with the storage capacitor.

In currently-used DRAM memory cells the storage capacitor can be implemented as a trench capacitor in which the two capacitor electrodes are disposed in a trench which extends into the substrate in a direction perpendicular to the substrate surface. According to another implementation of a DRAM memory cell the electrical charge is stored in a stacked capacitor, which is formed above the surface of the substrate.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3A illustrates a simplified plan view of a memory cell array of another embodiment.

FIG. 3B illustrates a simplified exemplary plan view of a memory cell array according to another embodiment.

FIG. 3C illustrates a simplified plan view of a memory cell array according to still another embodiment.

FIG. 4 illustrates a schematic layout of a memory device which may include the memory cell array of one embodiment.

FIG. 5 is a flow chart illustrating a method according to one embodiment.

FIG. 9 illustrates a schematic flow chart of a method according to another embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the present invention provide an integrated circuit having a memory cell array, and a method of forming an integrated circuit. In one embodiment, the present invention includes an interface and a memory device having a memory cell array. In another embodiment, the integrated circuit is coupled to a host to form a system. In another embodiment, the system is a computer system, including a memory cell array.

Although an integrated circuit having a memory cell array and a method of forming an integrated circuit having a memory cell array are described in detail with respect to a DRAM memory cell array including a storage capacitor which is implemented as a stacked capacitor, it is clearly to be understood, that the memory cell array and the method of forming a memory cell array as will be described hereinafter may be applied to any type of memory device. For example, the memory cell array may include memory cells of an arbitrary type. Examples include memory cells including an access device such as a transistor and a storage element. Examples of the storage elements include storage capacitors, resistive storage elements and others. Specific examples of the memory device include a magnetic memory device (MRAM), a phase changing memory (PCRAM), a conductive bridge memory (CBRAM), a ferroelectronic memory (FeRAM) and others.

Figure 1:
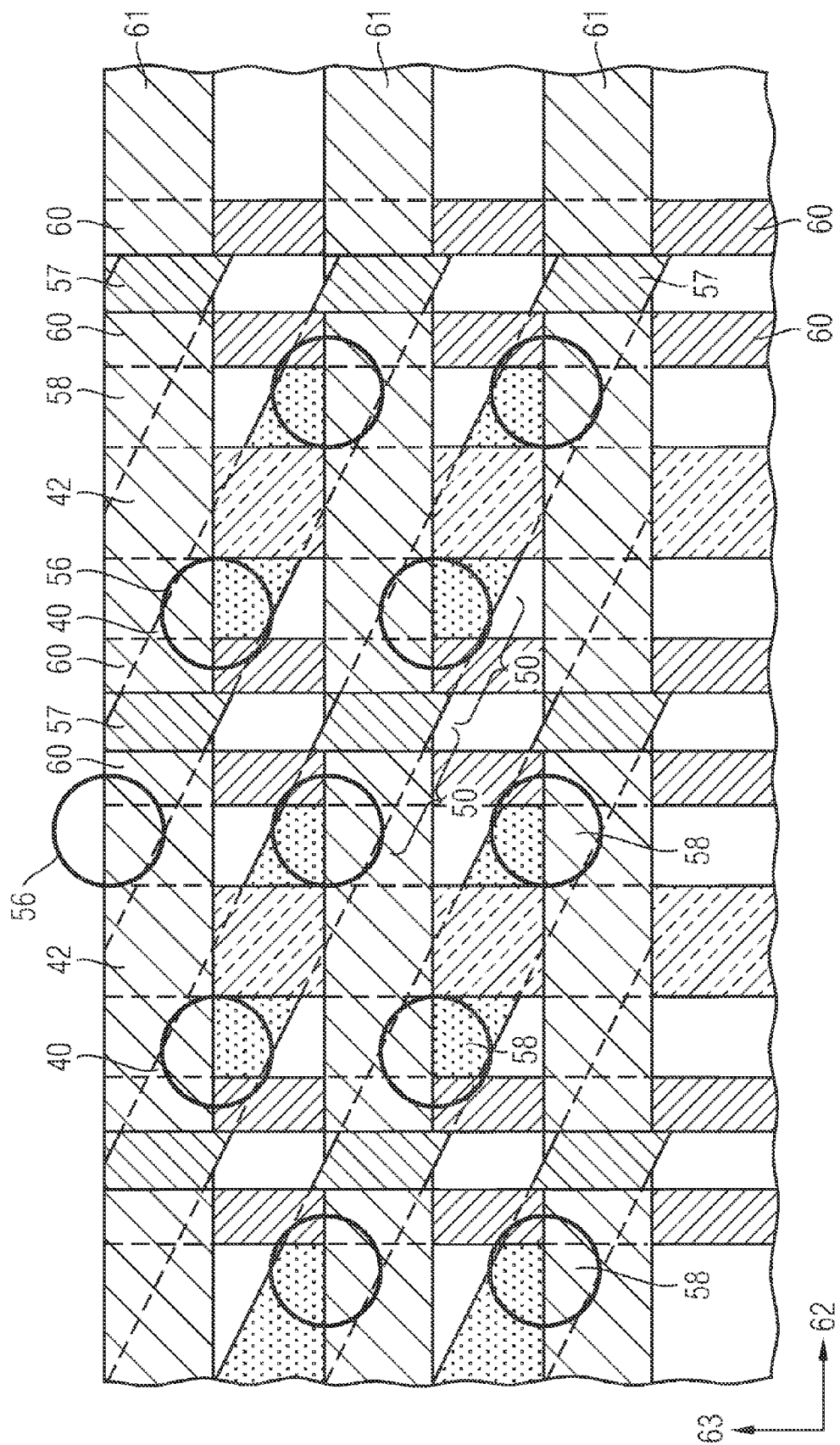
FIG. 1 illustrates a plan view of a memory cell array according to one embodiment.
Figure 2:
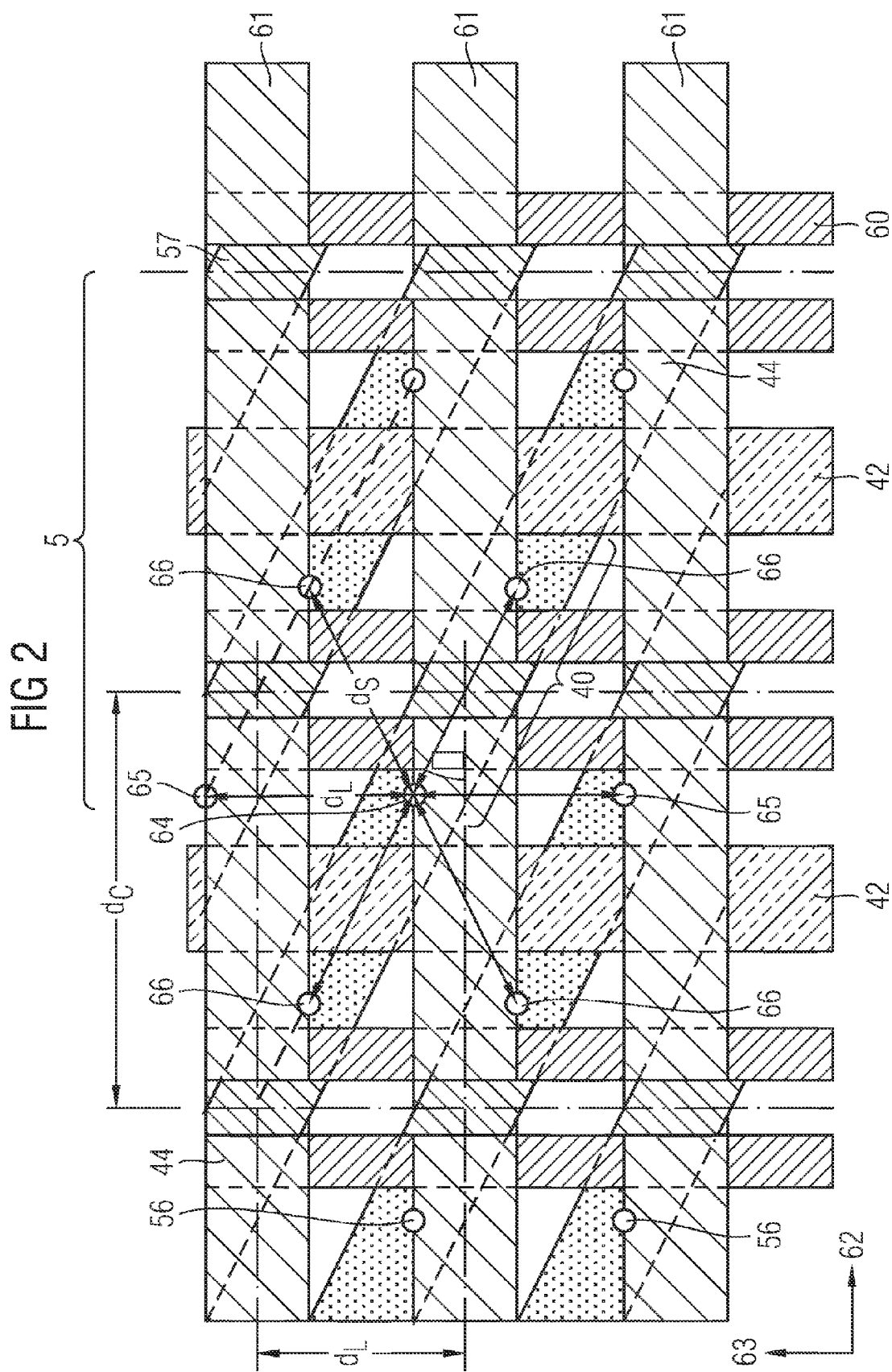
FIG. 2 illustrates another plan view of the memory cell array according to the embodiment illustrated in FIG. 1.

FIG. 1 illustrates an exemplary integrated circuit layout of a memory cell array according to one embodiment. As is illustrated, an integrated circuit including a memory cell array includes memory cells, bitlines running along a first direction, wordlines running along a second direction substantially perpendicular to the first direction, active area segments and bitline contacts. Neighboring bitline contacts are arranged in columns extending in the second direction and in rows extending in the first direction. As is illustrated in FIG. 2, a distance between neighboring bitlines is dL, dL being measured perpendicularly with respect to the first direction, and a distance between neighboring bitline contacts is dC, dC being measured parallel to the first direction. The following relation holds: $1/2.25 \leq dL/dC \leq 1/1.75$.

As can be seen from FIGS. 1 and 2, the memory cell array includes a plurality of bitlines 61, which run along a first direction 62. Moreover, the array further includes wordlines 60 which run along a second direction 63 which is substantially perpendicular to the first direction. The bitlines 61 may be arranged at a fixed distance dL which is measured along the second direction 63. Moreover, the wordlines 60 may be disposed at an irregular distance from each other. The memory cell array may be formed in a semiconductor substrate. The term "bitline contact" refers to a position at which the bitline is connected or in contact with a corresponding active area. Differently stated, a "bitline contact" generally refers to a position at which the bitline intersects a corresponding active area.

Each of the memory cells may include a storage element and a transistor connected with the storage element. The transistor may include a first and a second source/drain region, a channel connecting the first and the second source/drain region, and a gate electrode controlling an electrical current flow between the first and the second source/drain region. The transistor may be at least partially formed in a semiconductor substrate. The portion in which the transistor is formed generally is denoted as the active area. The gate electrode is electrically isolated from the channel by a gate dielectric. The gate electrode may form part of a wordline or may be formed as an isolated gate electrode which is connected with a corresponding wordline. The gate electrode may be implemented in an arbitrary manner. For example, the gate electrode may be formed a planar gate electrode. Alternatively, the gate electrode may be disposed in a gate groove which is defined in the semiconductor substrate. The transistor may be formed as a FinFET. Accordingly, the gate electrode may further include vertical portions which enclose the channel. For example, the channel may be enclosed at two or three sides thereof by the gate electrode. For example, the transistor may be formed as a FinFET, wherein the gate electrode additionally is disposed in a gate groove. By addressing the access transistor via the corresponding wordline, the information stored in the storage element may be read. For example, the information may be read out to a corresponding bitline via a bitline contact. Accordingly, the access transistor is adapted to electrically couple storage elements to corresponding bitlines. By way of example, the storage element may be a storage capacitor.

Active areas are formed in the semiconductor substrate. For example, the active areas may be formed by defining isolation trenches which are filled with an insulating material. As can be seen from FIG. 2, active area lines 44 may be formed. The active area lines 44 intersect the bitlines 61 and the wordlines 60. For example, in the layout illustrated in FIG. 1, two adjacent memory cells 50 are assigned to one active area 40. Each of the memory cells 50 includes a transistor (not illustrated in this drawing) and a storage element 56. The transistors are addressed by corresponding wordlines 60. Moreover, the second source/drain portion 53 of each of the transistors is connected with a corresponding bitline contact 57. The bitline contacts 57 are connected with corresponding bitlines 61. As can be seen in FIG. 2, the bitline contacts 57 are disposed at a distance dC, which is measured along the first direction. The bitline contacts 57 are formed in a region generally defined by an intersection of a bitline and a corresponding active area. As can be seen, neighboring bitline contacts are arranged in columns extending in the second direction and in rows extending in the first direction. Accordingly, the bitline contacts are formed in the pattern of a regular grid. Hence, as will be explained herein after, they can easily be patterned using a mask having a lines/spaces pattern. This mask may include a photomask as well as any suitable hardmask or other mask.

According to one embodiment, the ratio of dL/dC is more than 1/2.25 and less than 1/1.75. By way of example, the ratio of dL/dC may be approximately 0.5. Accordingly, an angle α between the active area lines and the bitlines 61 may be approximately 20 to 30°, and may, for example, be 25 to 28°, for example, 26.5° (26.5°=arctan (1/2)). In this respect, the angle α between the active area lines 44 and the bitlines is defined by a line connecting diagonally shifted bitline contacts. Such a line extends from a selected bitline contact to another bitline contact which is reached by moving from the selected bitline contact to the neighboring bitline contact along the first direction 62 and by moving from this bitline contact to the neighboring bitline contact in the second direction 63, or vice versa.

FIG. 2 illustrates another plan view of the layout of the memory cell array according to one embodiment. As can be taken from FIG. 2, the active areas 40 may be disposed so as to form active area lines 44 which are implemented as straight lines. The active areas 40 which are assigned to the same active area line 44, may be isolated from each other by an isolation device 42. For example, the isolation device 42 may be implemented as a segmentation trench which is filled with an insulating material. Alternatively, the isolation device 42 may be implemented as an isolation gate line which acts as a transistor in an off-state. For example, the width of the isolation gate line may be larger than the width of the wordlines 60. Neighboring bitline contacts are connected with neighboring bitlines. In this respect, neighboring bitline contacts refer to bitline contacts which are assigned to one active area line. As can further be taken from FIG. 2, the storage elements 56 may be arranged in the shape of a hexagon. For example, a hexagon may be made up of six storage elements 65, 66 which are arranged around one central storage element 64. For example, the hexagon includes two vertically dislocated storage elements 65 and four diagonally dislocated storage elements 66. The vertically dislocated storage elements 65 have a distance corresponding to dL with respect to the central storage element 64. Moreover, the diagonally dislocated storage elements 66 have a distance corresponding to ds with respect to the central storage element 64. For example, ds may be different from dL.

As can be taken from FIG. 3, the active areas 40 may be formed as segmented active areas 40. In this respect, the term "segmented active area" refers to an active area which is segmented at an early process step. Accordingly, the active areas may be formed as isolated active areas by defining the isolation trenches. In case, the active areas 40 are isolated by an isolation device 42, they are, first, formed as active area lines or line-like structures and, then, segmented in a later process step. Accordingly, embodiments of the invention may include active areas which are segmented at an early process and active areas which are isolated at a later processing step. Nevertheless, although the single active areas 40 are formed as segmented active areas, they may be arranged in lines being referred to as active area lines. The lines 41 may be straight or angled lines. For example, FIG. 3B illustrates an embodiment, in which the active area lines 44 are formed as angled active area lines 44. For example, in the embodiment illustrated in FIG. 3B, neighboring active areas 40 are shifted in a direction which is perpendicular to the longitudinal direction of each of the active areas 40. Moreover, in case the active areas 40 are implemented as segments, it is not essential that they have a shape as is indicated in FIG. 3A or 3B, respectively. As can be seen in FIG. 3C, the single active areas 40 may, for example, have an angled shape to increase a contact area. As can be taken from FIG. 3C, the active area segments 40 are also disposed in active area lines 44, the direction of the active area lines being defined by the longitudinal direction of each of the active areas 40. In the embodiment illustrated in FIG. 3C, the active area lines 44 are implemented as straight lines.

FIG. 4 is a simplified schematic diagram describing a pair of memory cell arrays 5, 5' according to one embodiment. Each of the memory cell arrays 5, 5' may be implemented in a manner as has been described with reference to FIGS. 1 to 4. The arrays may be implemented in an open bitline configuration, each array employing memory cells 50 including a transistor 51 and a storage element 56.

Each of the memory cell arrays 5, 5' may be coupled to a respective group of bitlines 61, 61' and a respective group of wordlines 60, 60'. The two groups of bitlines 61, 61' may couple the memory cell arrays 5, 5' to sense amplifiers 59. The sense amplifiers 59 are typically formed in the peripheral portion of the memory device.

In a read operation, a memory cell 50 is selected, for example, by activating one wordline 60. The wordline 60 is coupled to a respective gate electrode of a respective transistor 51. The bitline 61 is coupled to the first source/drain region of one of these transistors 51 via a bitline contact 57. When the transistor 51 is turned on, the charge stored in the storage element is coupled to the associated bitline 61. The sense amplifier 59 then senses the charge coupled from the storage element 56 to the bitline 61. The sense amplifier 59 compares this signal with a reference signal such as the reference charge qref or a reference signal which is obtained by sensing a corresponding bitline 61' without a voltage being applied to the corresponding wordline 60'. The sense amplifier 59 amplifies the resulting signal and latches the amplified signal for an appropriate duration. This allows data represented by the charge stored in the storage element 56 to be accessed and also allows the storage element 56 to store charge that is representative of the data from the memory cell 50 back into the memory cell 51. As is obvious to the person skilled in the art, any alternative array architecture such as a vertically twisted bitline array architecture which is generally known, can be used as well.

FIG. 5 is a flow-chart illustrating the method of forming a memory cell array according to one embodiment. As will be described, a method of forming a memory cell array may include defining active area lines in a substrate having a surface. Lines of a first hard mask material are provided that intersect the active area lines. The lines of the first hard mask material are provided at positions at which bitline contacts are to be formed. Isolation structures are provided in the active areas in a self-aligned manner with respect to the positions of the lines of the first hard mask material, respectively.

As can be seen, first, active area lines are defined in a substrate having a surface (S1). Thereafter, lines of a first hard mask material are provided at positions at which bitline contacts are to be formed. The lines of the first hard mask material intersect the active area lines (S2). Then, isolation structures are provided in the active areas in a self-aligned manner with respect to the positions of the lines of the third hard mask material, respectively (S5). By way of example, this may be accomplished by providing first and second lines of a sacrificial material. The first and second lines of the sacrificial material are provided so as to be adjacent to a first and a second side of each of the lines of the third hard mask material, respectively (S3). Thereafter, first and second lines of a second hard mask material are provided adjacent to the first side of the first lines of the sacrificial material and adjacent to the second side of the second line of the sacrificial material, respectively (S4). As a result, an uncovered substrate portion may be left between the second and the first lines of the second hard mask material, respectively. Alternatively, a liner layer or a hardmask layer may be disposed on a surface portion. Accordingly, an uncovered substrate portion may be defined by removing a portion of this liner layer or hardmask layer. Thereafter, the isolation structures are defined at the positions of the uncovered substrate portions. Optionally, thereafter, the lines of the sacrificial material are removed so as to expose a portion of the substrate surface. At this position, the gate openings may be defined (S6). The gate electrode is provided at the position of the gate opening (S7). In the next processes, the lines of the first hard mask material may be removed so as to define openings for forming bitline contacts (S8). Thereafter, the bitline contacts are formed at the positions of the openings for forming bitline contacts (S9). Moreover, the lines of the second hard mask material may be removed so as to define capacitor contact openings (S10). Moreover, capacitor contacts may be defined at the positions of the capacitor contact openings. Thereafter, a plurality of storage elements in contact with the capacitor contacts are provided.

In a method according to one embodiment, the lines of the first and second hard mask material may be simultaneously removed or they may be removed in any arbitrary succession. Moreover, the bitline contacts and the bitlines may be formed by performing common processes, for example. The conductive layer may be deposited over the surface and the bitline contacts as well as the bitlines may be simultaneously formed by patterning the conductive layer.

For example, the lines of the sacrificial material may be formed by a spacer process including conformally depositing the sacrificial material and performing an anisotropic etching step, wherein horizontal portions of the sacrificial material are removed and vertical portions may remain. Likewise, the lines of the second hard mask material may be formed by a spacer process in a similar manner.

For example, the material of the first hard mask may be identical with the material of the second hard mask. Nevertheless, they may as well be different from each other. The isolation structure may be formed in an arbitrary manner. For example, by etching the substrate material to form a segmentation trench. Thereafter, for example, an insulating material may be filled into the segmentation trench. Moreover, it is also possible, that the segmentation trench is filled with a gate dielectric material, followed by a conductive material so as to form an isolation gate line. The method may further include depositing a hardmask layer (S21) after defining the active area lines and before providing the lines of the first hardmask material.

In the following, a method of forming a memory cell array according to one embodiment will be described in detail. As is clearly to be understood, the method can be used for manufacturing the memory cell array illustrated in FIGS. 1 to 3. Nevertheless, it can also be used for manufacturing a memory call array having an arbitrary layout. As is common, during this method several processes will be performed so as to pattern specific material layers. Generally, for patterning material layers, a photolithographic method may be used in which a suitable photoresist material is provided. The photoresist material is photolithographically patterned using a suitable photomask. The patterned photoresist layer can be used as a mask during subsequent processes. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

Figure 6A:
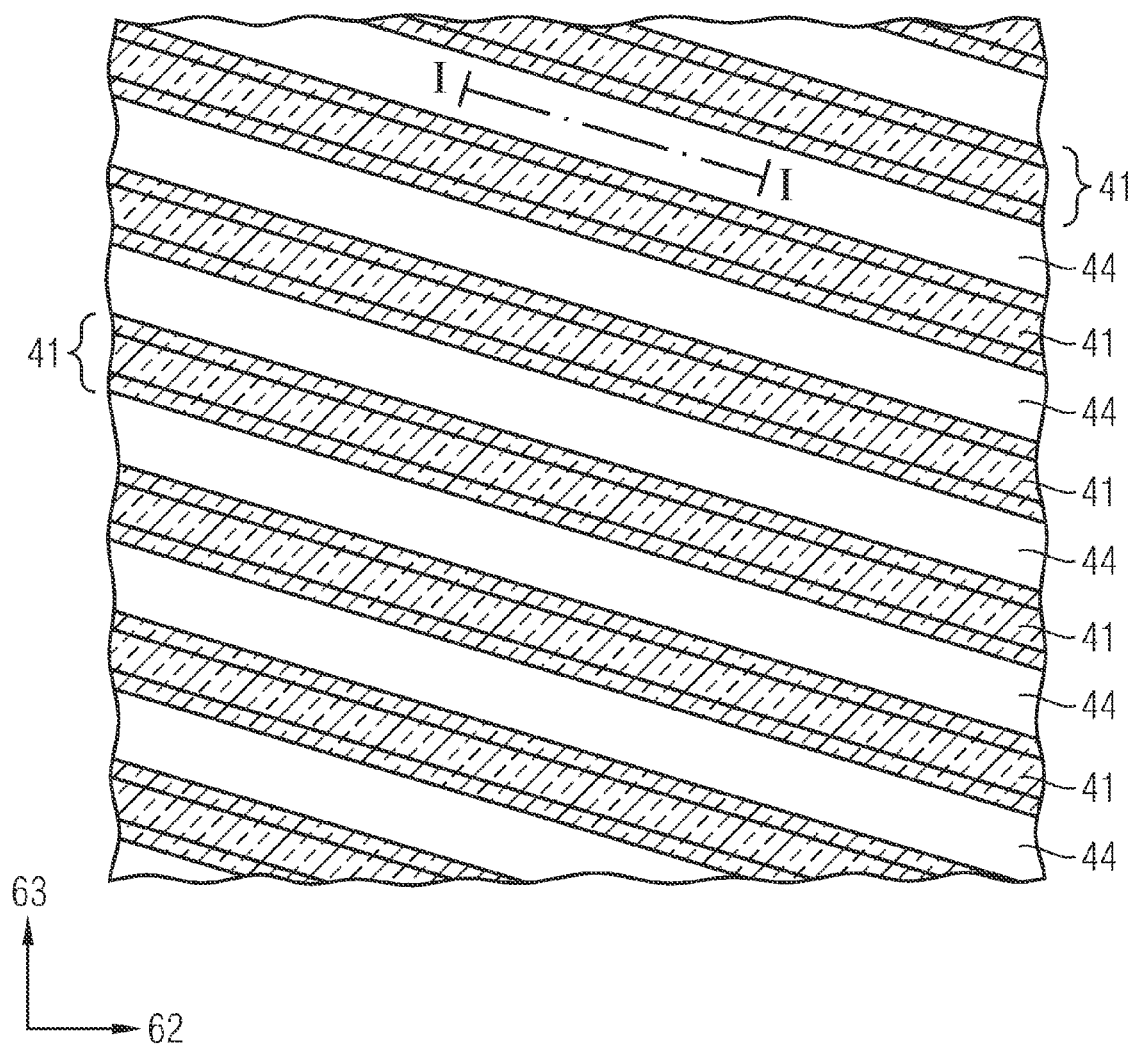
FIGS. 6A to 6R illustrate a method of forming a memory cell array according to one embodiment.

A semiconductor substrate is provided, which may, for example, be a silicon wafer, for example a p-doped silicon wafer, first, active area lines 44 are defined. As is illustrated in FIG. 6A, for example, the active area lines 44 may be defined by patterning isolation trenches in the semiconductor substrate surface as is common. For defining the isolation trenches, first, a pad-oxide layer may be deposited, followed by a comparatively thick silicon nitride layer (not illustrated).

The isolation trenches may be defined photolithographically so as to extend in a direction which is slanted with respect to the wordlines and the bitlines to be formed in a separate process step. By way of example, the isolation trenches may be defined as straight lines. Nevertheless, as is obvious to the person skilled in the art, they may also be formed as angled lines. In addition, the isolation trenches may be defined in such a manner so as to form active areas which are formed as segmented lines or islands. Since the implementation of all these modifications is obvious to the person skilled in the art, they will not be described in more detail. For the sake of simplicity, in the following it is assumed that the active area lines are formed as straight lines 44. Accordingly, isolation trenches 41 which are formed as straight lines may be etched into the substrate surface and are filled with an insulating material as is common. As a result, the structure illustrated in FIG. 6A is obtained. FIG. 6A illustrates a plan view on a semiconductor substrate in which active area lines 44 are defined, the active area lines 44 being isolated from each other by isolation trenches 41. The isolation trenches 41 are filled with an insulating material as is common. The isolation trenches 41 extend in a direction which intersects a first direction 62 and a second direction 63.

Next, spacer processes are employed for forming lines of a predetermined material. In more detail, lines of a sacrificial material are formed and, thereafter, a layer of the predetermined material is formed on the sidewalls of the lines of the material. After removing the lines of the sacrificial material, lines having a sub-lithographic feature size may remain. For example, a spacer may be formed by conformally depositing a layer of predetermined material, followed by an anisotropic etching process so as to etch the horizontal portions of the conformally deposited layer. As a result, lines having a thickness which is smaller than a photolithographic feature size F which may be obtained by the technology employed, may be formed.

In the following figures, the cross-sectional views between I and I are taken along an active area line as can be gathered from FIG. 6A.

In the method described herein after, various hard mask layers and sacrificial layers are to be used. Examples of the materials of the hard mask and sacrificial layers may, for example, include silicon oxide, for example $SiO_2$, silicon nitride, for example $Si_3N_4$, SiON, polysilicon, carbon, for example, carbon layers which are made of elemental carbon, and other suitable hard mask layers which are generally used in the art. Although in the following, specific examples are given for the respective layers, it is clearly to be understood, that the specification is not restricted to the materials given as an example below. Nevertheless, any other suitable material may be used as the respective layer.

Figure 6B:
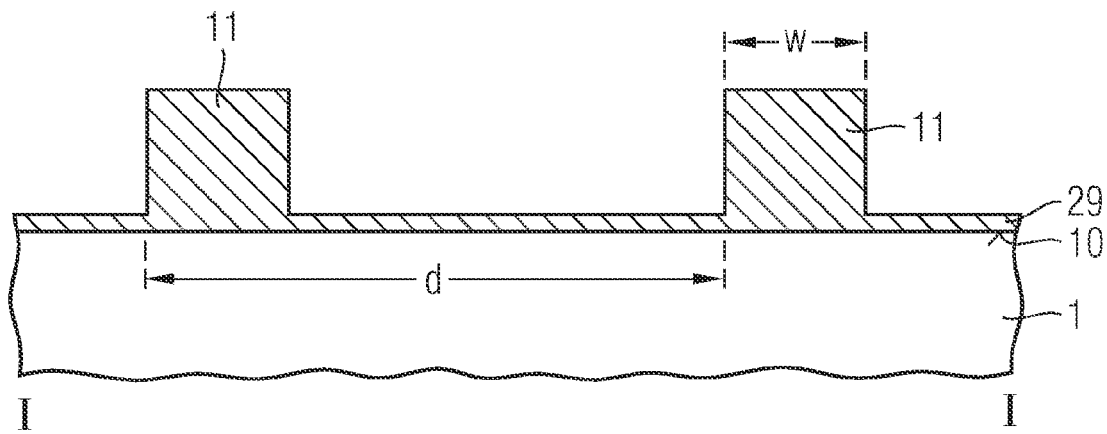

On the substrate illustrated in FIG. 6A, for example, optionally an ion implantation process may be performed so as to define source/drain portions of the transistors to be formed. Then, lines of a first hard mask material are formed. A cross-sectional view of an exemplary resulting structure is illustrated in FIG. 6B. For example, the first hard mask material may be silicon nitride. For forming the silicon nitride lines 11, the silicon nitride layer 11 is deposited and photolithographically patterned so as to form lines. The line width w of the silicon nitride lines 11 may correspond to the contact area of the bitline contacts to be formed. The silicon nitride lines 11 are disposed at a distance d. The silicon nitride lines 11 are formed over the surface 10 of the semiconductor substrate 1. To be more specific, the silicon nitride lines 11 are formed on the surface of the active area lines 44. Then, a thin silicon nitride layer 29 is formed so as to cover the surface 10 of the substrate 1. By way of example, the silicon nitride layer 29 may have a thickness of more than 2 nm and, for example, less than 10 nm, for example 3 nm. The silicon nitride layer 29 may be formed by a nitridation process. As is clearly to be understood, layers 29 and lines 11 may be made of the same or of different materials. Moreover, the succession of the layers 29 and 11 is arbitrary. By way of example, first, the layer 29 may be deposited, followed by the lines 11 or as has been described above, first the lines 11 may be formed, followed by the layer 29. Accordingly, the lines 11 may be in direct contact with the substrate surface 1 or they may be adjacent to layer 29 which is in direct contact to the substrate surface 1. Thereafter, first and second lines 12a, 12b of a sacrificial material such as polysilicon are formed. To this end, first, a polysilicon layer is conformally deposited, followed by an anisotropic etching process, such that the polysilicon lines are directly adjacent to the sidewalls of the silicon nitride lines 11. The width of each of the first and second polysilicon lines 12a, 12b may correspond to the width of the buried wordlines to be formed. The resulting structure is illustrated 6C.

Figure 6C:
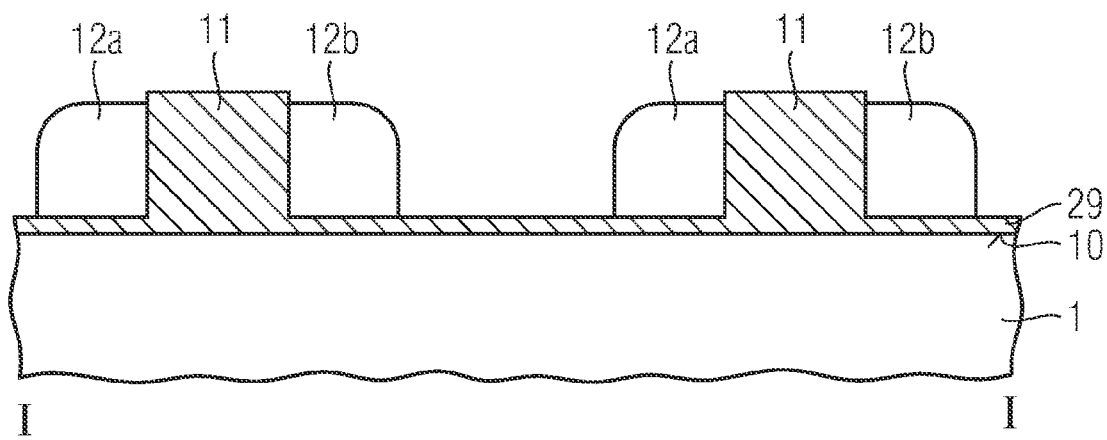
Figure 6D:
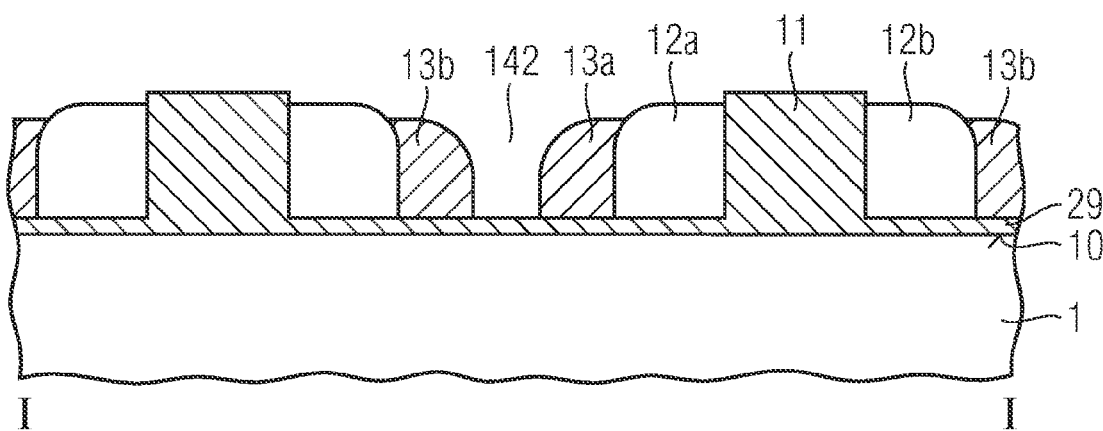

Thereafter, as can be seen from FIG. 6D, a further set of lines of a second hard mask material, for example of silicon nitride lines 13a, 13b are formed by a spacer process which has been described above. The first silicon nitride lines 13a are adjacent to the first polysilicon lines 12a, whereas the second silicon nitride lines 13b are adjacent to the second polysilicon lines 12b. The width of each of the silicon nitride lines 13a, 13b may correspond to the landing area of the capacitor contacts to be formed. The resulting structure is illustrated in FIG. 6D. As can be seen on either side of each of the silicon nitride lines 11, a sequence of a polysilicon line 12a, 12b followed by a further silicon nitride line 13a, 13b is formed. Portions 142 are disposed between the second silicon nitride lines 13b and the first silicon nitride lines 13a, respectively.

Figure 6E:
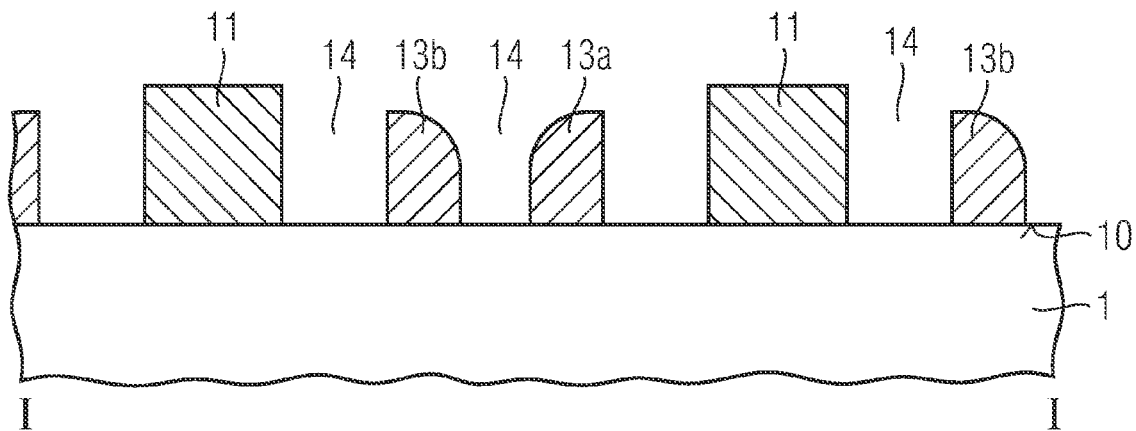

Thereafter, the first and second polysilicon lines 12a, 12b are removed, followed by an etching process for etching silicon nitride. Accordingly, substrate portions 14 become uncovered. By way of example, these etching processes may be selective. For example, the first and second polysilicon lines may be etched selectively with respect to silicon nitride or vice versa. Moreover, any of the etching processes may be anisotrop. The resulting structure is illustrated in FIG. 6E.

Figure 6F:
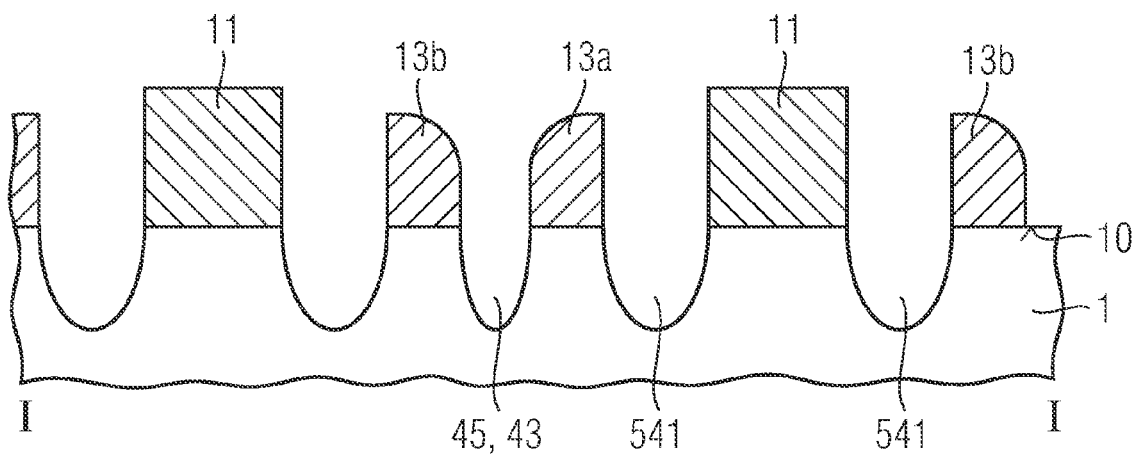

Thereafter, as is illustrated in FIG. 6F, a selective etching process is performed so as to etch the silicon substrate material and silicon oxide selectively to silicon nitride. As a result, an isolation device groove 45 or a segmentation trench 43 as well as gate grooves 541 are formed. To be more specific, next an isolation device is to be formed in the trench 43, 45. The isolation device can be implemented as an isolation field effect transistor including an insulating structure which is made of an insulating material. Alternatively, the isolation device may be implemented as an isolation gate which is operated in an off-state so as to prevent a current from flowing between adjacent active areas. The gate grooves 541 may have a width and a depth which is different from the width and the depth of the isolation device groove 45 or the segmentation trench 43. Although not illustrated in the drawings, the width of the isolation device groove 45 or the segmentation trench 43 may be larger than the width of the gate groove 541.

Optionally, a further etching may be performed so as to define the vertical portions of the gate electrode to be formed. For example, the vertical portions may be formed in the isolation trenches or adjacent to the isolation trenches before and behind the depicted plane of the drawing.

Figure 6G:
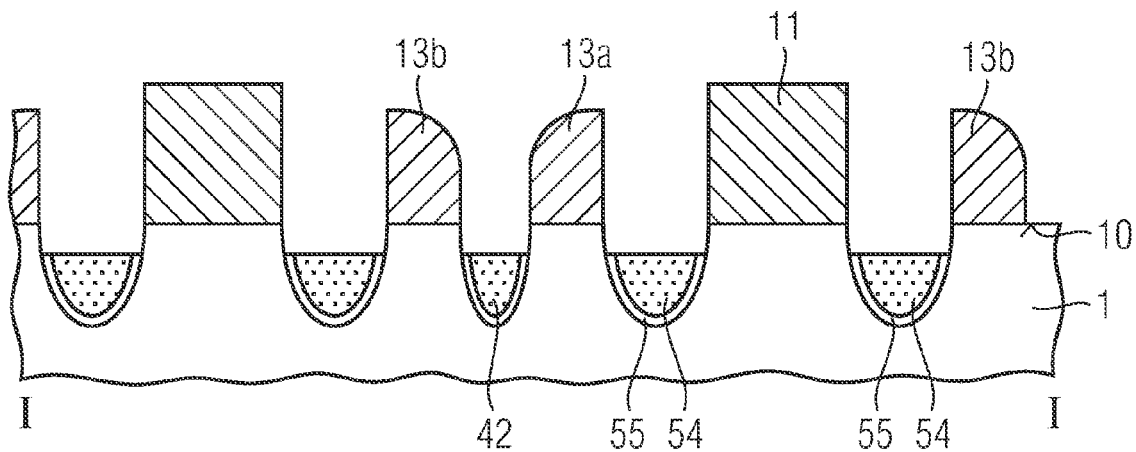

Then, a gate dielectric is formed on the surface of the gate grooves 541 and the openings 43, 45. The gate grooves 541 and the openings 43, 45 are filled with a conductive gate material 54. Thereafter, a recessing process may be performed in order to recess the gate material from the gate grooves 541 and the openings 43, 45. FIG. 6G illustrates the resulting structure.

Figure 6H:
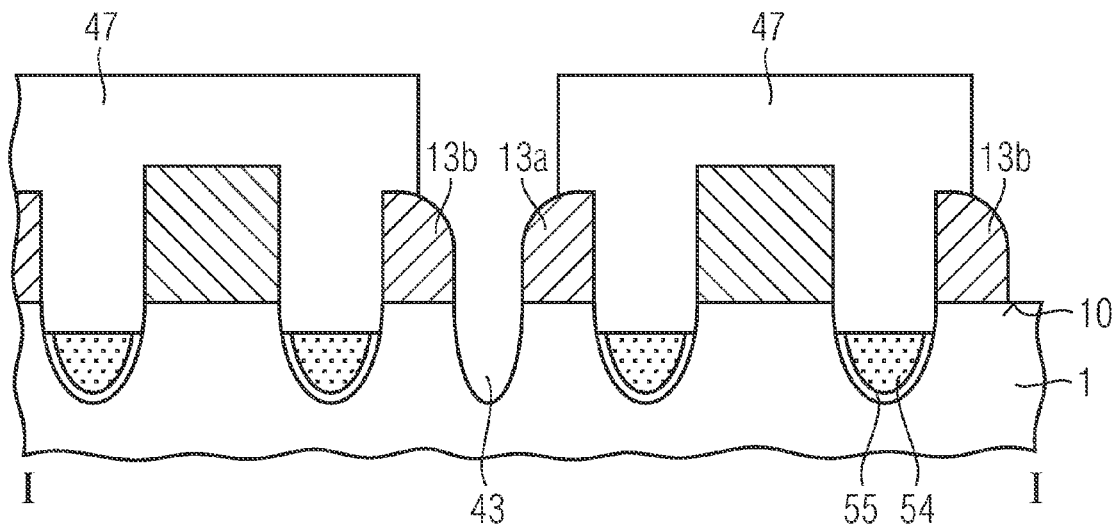

As has been mentioned above, the gate material 54 as well as the gate dielectric 55 may be maintained in the openings 43, 45, thus forming an isolation device 42. Nevertheless, the gate material 54 may as well be removed from the opening. To this end, a suitable resist material 47 may be applied and patterned so as to expose the surface of the isolation device groove 45. Then, an etching process is performed for removing the gate electrode material 54 as well as the gate dielectric 55 from the opening 43. The resulting structure is illustrated in FIG. 6H.

Then, the resist material 47 is removed. A dielectric material 19 such as silicon oxide, spin-on glass or another insulating material which is well known in the art is provided in the opening 43 and on top of the gate material 54 by generally known methods. The resulting structure is illustrated in FIG. 6I.

Figure 6I:
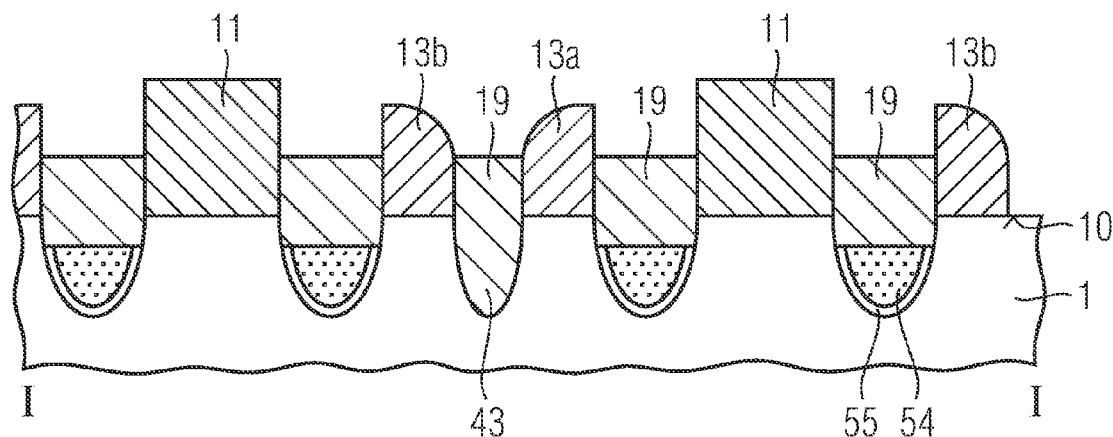

As can be seen from FIG. 6I, the gate electrodes which form part of corresponding wordlines are implemented as completely buried wordlines. Accordingly, the surface of each of the gate electrodes 54 is disposed beneath the substrate surface 10.

In the following description, the processes will be illustrated for further processing the memory cell array in case the isolation device is implemented as a groove filled with a dielectric material. Nevertheless, as is obvious to the person skilled in the art, in the same manner the memory cell array could be further processed when using the isolation gate which is depicted in FIG. 6G.

According to one embodiment, a silicon nitride etching process may be performed so as to remove all the silicon nitride lines 11, 13. After removing the silicon nitride lines 11, 13, the substrate surface 10 will be exposed at positions 16 at which the bitline contacts are to be formed. Moreover, the substrate surface 10 will be exposed at positions 25, at which the capacitor contacts are to be formed. The resulting structure is illustrated in FIG. 6J.

Figure 6J:
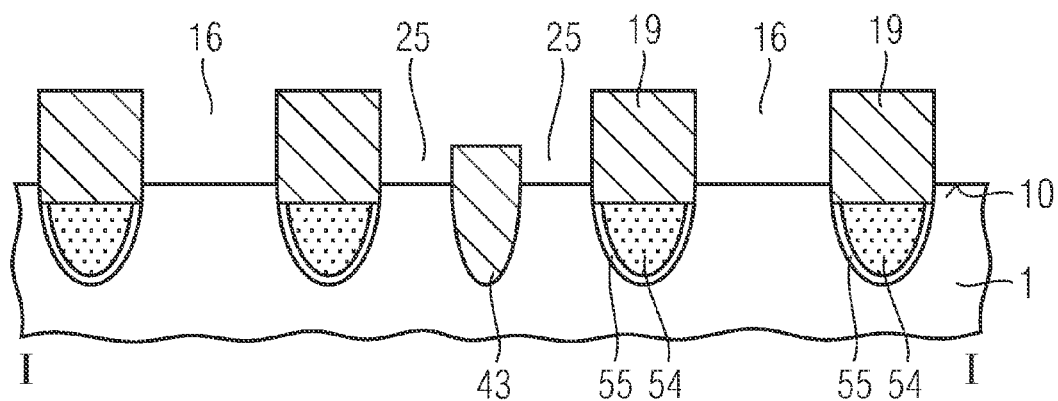
Figure 6K:
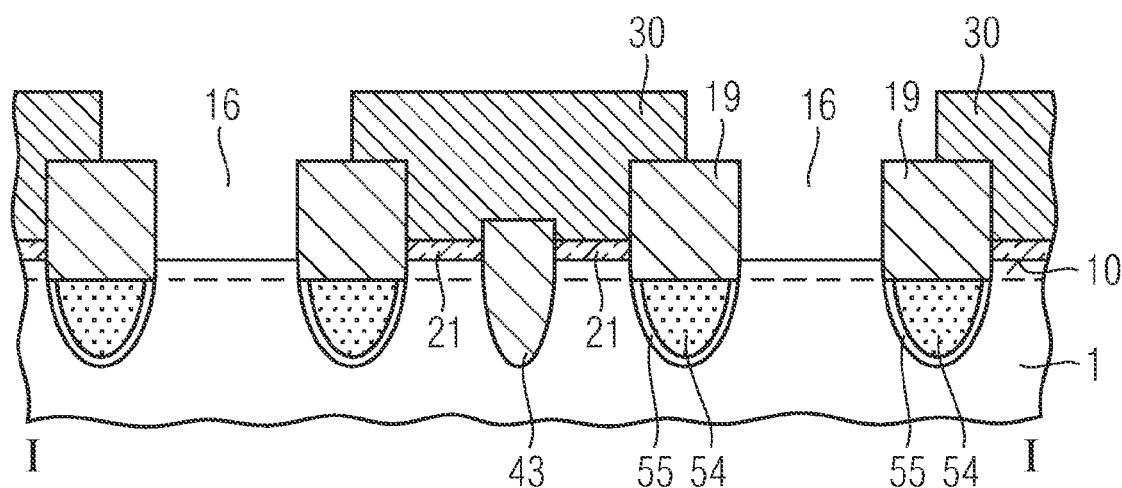

Starting from the structure illustrated in FIG. 6J, first, an ion implantation process may be performed so as to define the first and second source/drain portions 52, 53. Thereafter, the bitlines including the bitline contacts may be provided in a manner as is conventional. Moreover, the capacitor contacts are defined and the storage capacitors may be formed on top of the resulting surface of the structure as is common. An exemplary process flow will be described in the following. First, a dielectric layer 21 may be deposited and patterned using a photolithographic method employing a mask having a lines/spaces pattern. For example, a photoresist layer 30 may be disposed on top of the dielectric layer 21. By way of example, the dielectric layer 21 may be the gate dielectric layer which is employed in the support portion of the memory device. After patterning the photoresist layer 30 using a suitable mask, an etching process is performed so as to remove the dielectric layer 21 from the portions at which a bitline contact opening 16 is to be formed. An exemplary cross-sectional view is illustrated in FIG. 6K. For example, the lines of the photoresist material 30 may extend parallel to the wordlines 60 illustrated in FIGS. 1 and 3.

Figure 6L:
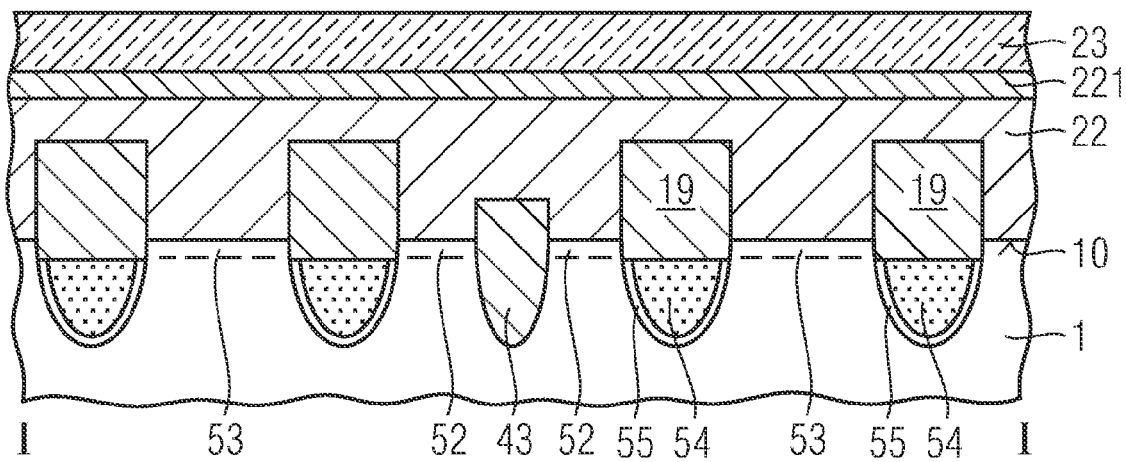

After removing the remaining portions of the photoresist layer 30, a further conductive material 22 such as polysilicon or any other suitable conductive material, for example, a metal or a semiconductor metal compound is deposited. Additionally, a further conductive material 221, for example, a metal layer or a metal compound layer 221 may be deposited. For example, the conductive material 22 or the combination of layers 22, 221 may be used for defining the gate electrodes in the support portion. Thereafter, a suitable insulating layer, such as a silicon nitride layer 23 may be deposited. The resulting structure is illustrated in FIG. 6L.

As can be seen, now, the polysilicon material is filled in the spaces between adjacent lines of dielectric material 19, thus forming bitline contacts 57. A suitable resist material 241 is deposited and patterned for forming an etching mask for etching bitlines.

For example, the bitlines may be patterned using a mask having a lines/spaces pattern extending in the first direction. By this patterning step, the capacitor contact openings 25 may be formed. The residues of the resist material 241 may be removed and a silicon nitride layer for forming a silicon nitride spacer may be conformally deposited and anisotropically etched so as to form a silicon nitride spacer 28. A dielectric material (not illustrated) is deposited and anisotropically etched so as to laterally insulate the resulting bitlines. The resulting structure is, for example, illustrated in FIG. 6M.

Figure 6M:
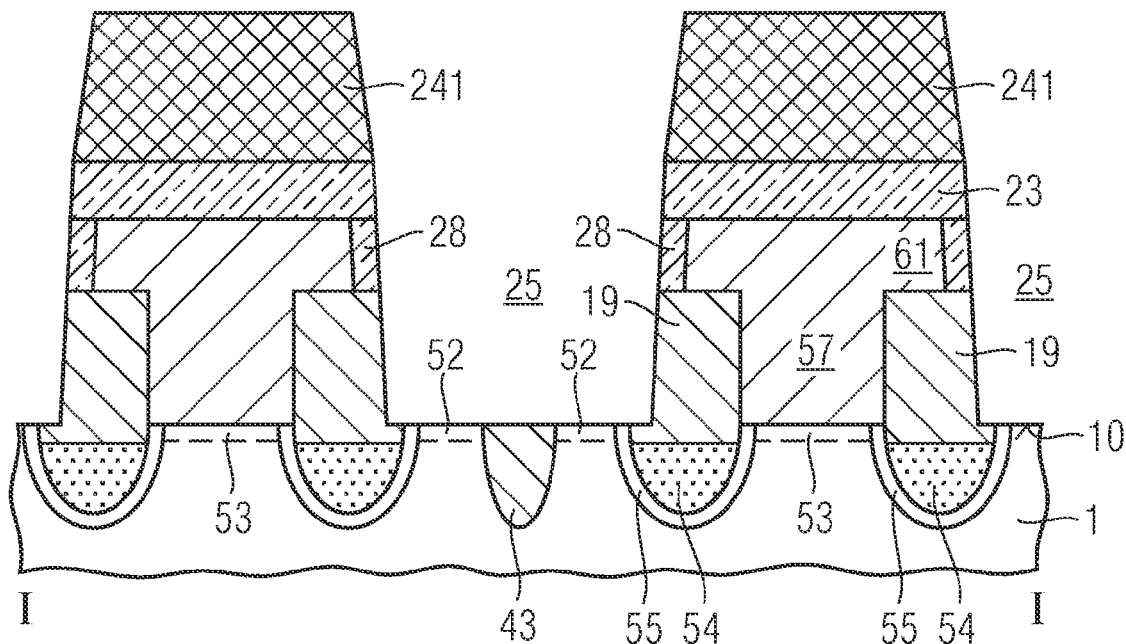
Figure 6N:
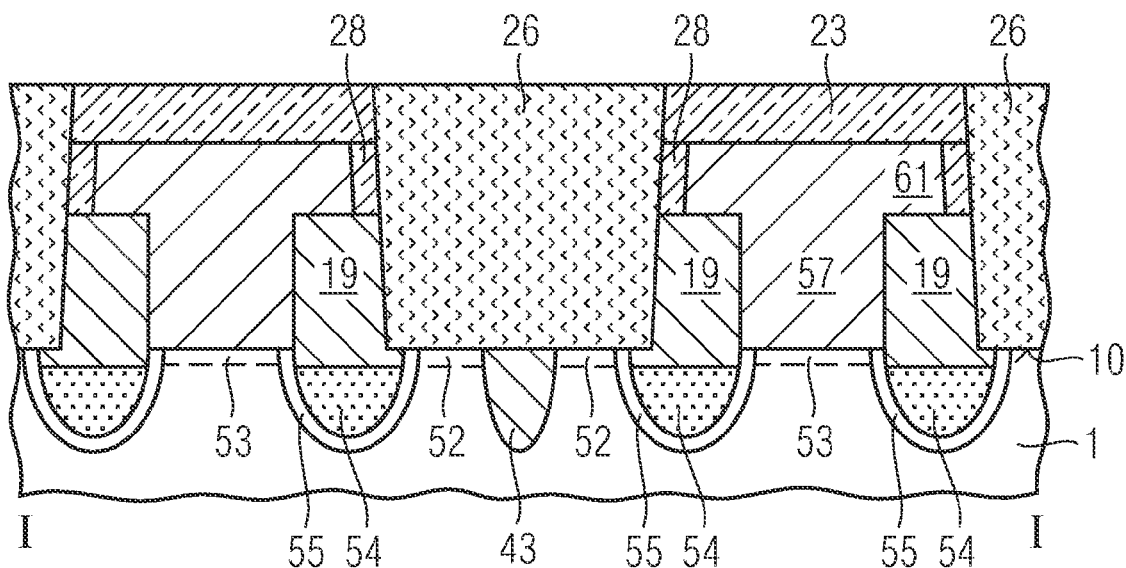

As can be seen from FIG. 6M, capacitor contact openings 25 are formed between adjacent bitlines at a position so as to be in contact with the substrate surface 10. The capacitor contact openings may be formed so as to have a larger diameter in the upper part then in the lower portion thereof. A conductive material such as polysilicon 26 is filled into the capacitor contact openings 25. A planarization process is performed so as to obtain a smooth surface. After the planarization step, for example, a CMP step, the individual active areas are segmented. The resulting structure is illustrated in FIG. 6N.

Figure 6O:
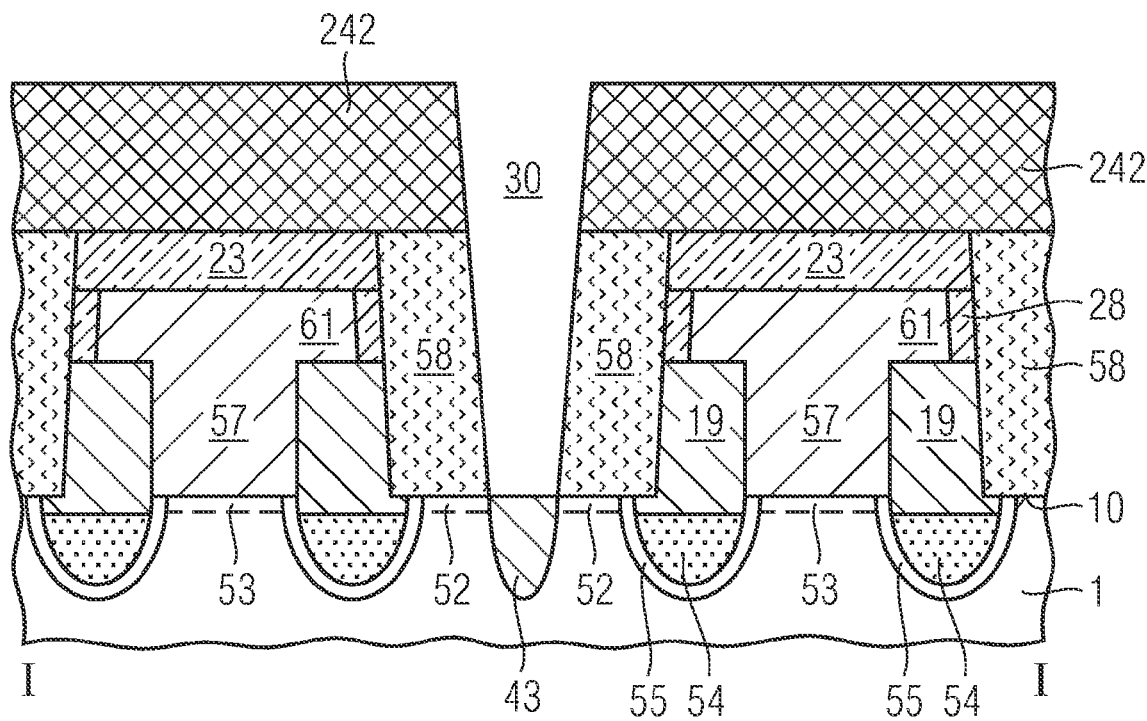

A further lithographic process is performed so as to define openings which extend to the segmentation trench 43 and isolate adjacent transistors from each other. To this end, a second masking material 242 is deposited and photolithographically patterned so as to form openings 30. The resulting structure is illustrated in FIG. 6O.

Figure 6P:
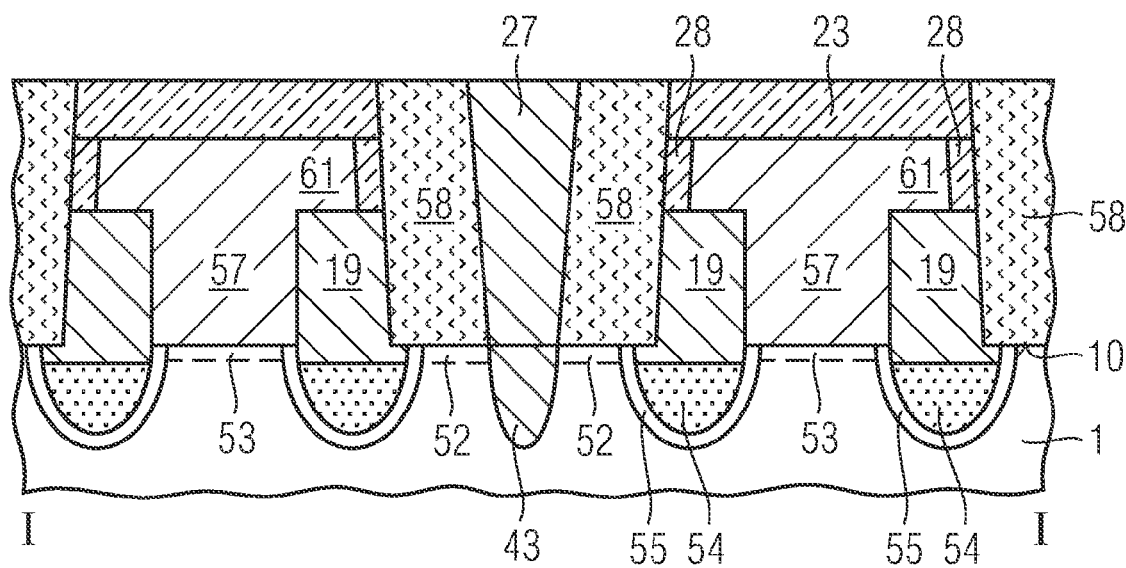
Figure 8:
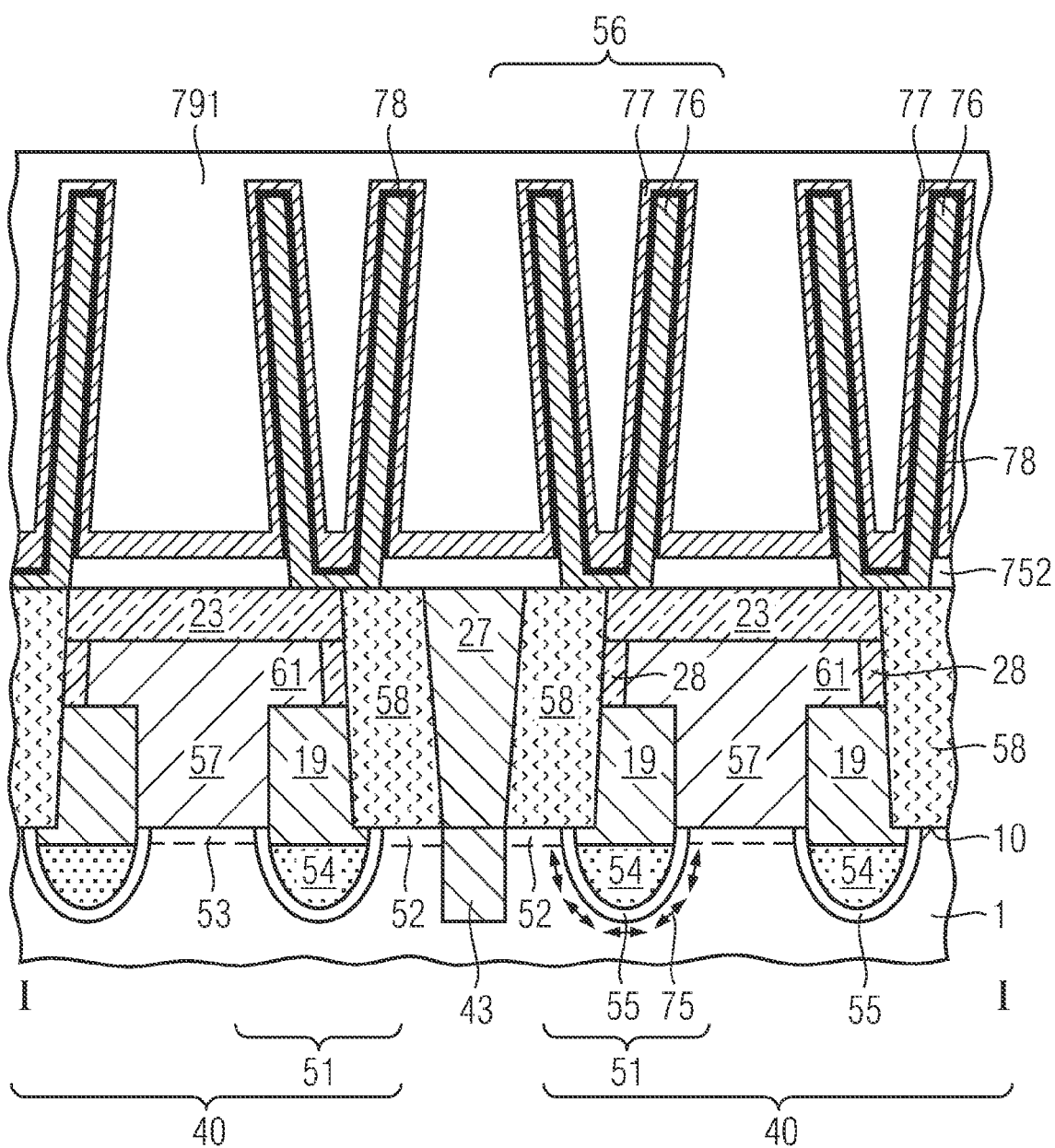
FIG. 8 illustrates a cross-sectional view of a memory cell array according to one embodiment.

A dielectric material 27 is filled in the openings 30 to insulate adjacent capacitor contacts 58 from each other. The resulting structure is illustrated in FIG. 6P. Finally, the storage capacitors may be provided on top of the silicon nitride layer 23 in a manner as is conventional. To this end, first, the first capacitor electrode may be formed, followed by a capacitor dielectric 78 and a second capacitor electrode 77. Thereafter, a further dielectric material 791 is filled in the spaces between the capacitors. The second capacitor electrodes 77 are insulated from the capacitor contacts by the dielectric material 792. Nevertheless, as is clearly to be understood, the storage capacitor may be implemented in any arbitrary other manner. A cross-sectional view of the memory cell is illustrated in FIG. 8, for example.

Figure 6Q:
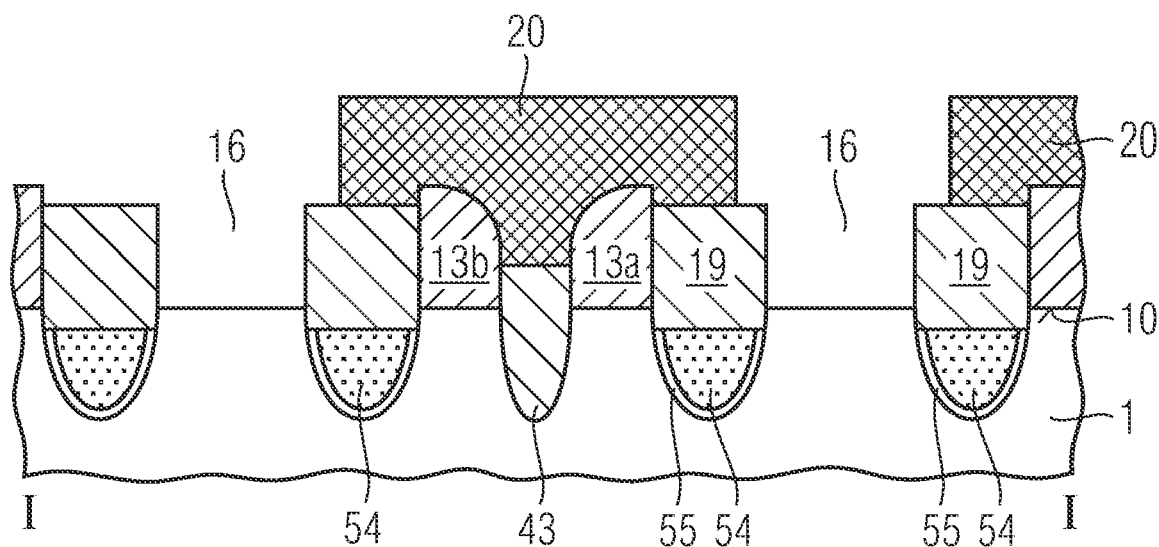

According to another embodiment, as is illustrated in FIG. 6Q, first, the second silicon nitride lines 13*a*, 13*b* are masked with a suitable masking material 20 such as a photoresist material or an appropriate hard mask material. As a result, the first silicon nitride lines 11 are left uncovered. Thereafter, an etching process for etching silicon nitride is performed. As a consequence, the first silicon nitride lines 11 are removed, whereas the second silicon nitride lines 13*a*, 13*b* are protected by the cover layer 20. Accordingly bitline contact openings 16 are formed between adjacent portions of the cover layer 20. The resulting structure is illustrated in FIG. 6Q. According to another embodiment, the respective groups of lines may be made of different materials which can be etched selectively to each other, thus allowing to avoid the use of photoresist or other appropriate hard mask material as described above.

Figure 6R:
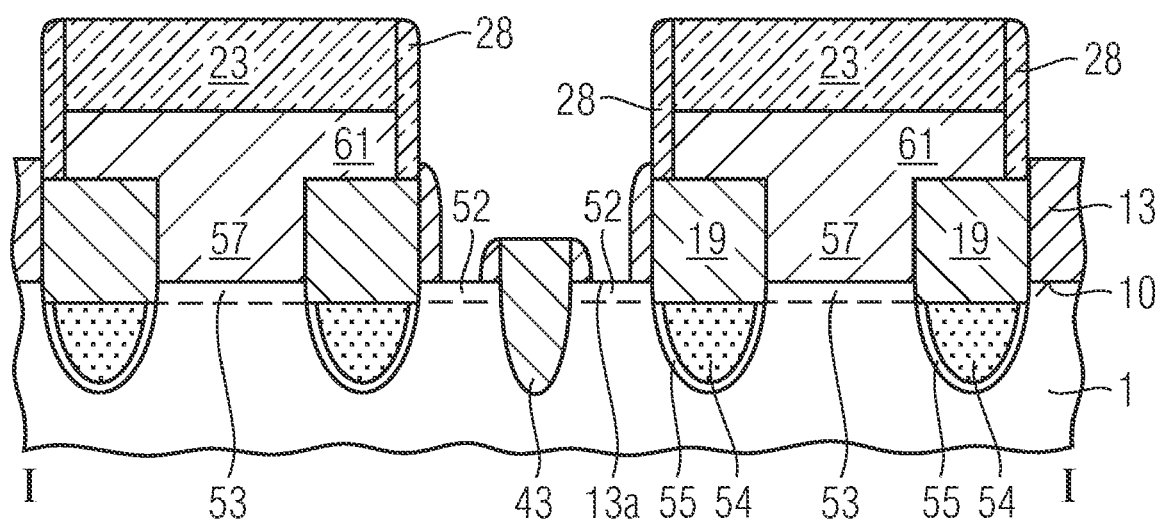

In the next processes, the remaining portions of the cover layer 20 are removed. An ion implantation process may be performed in order to define the second source/drain portion 53. Then, a conductive material for constituting the bitlines and the bitline contacts may be deposited and patterned so as to form the bitlines and the bitline contacts. Thereafter, a silicon nitride layer is conformally deposited, followed by an anisotropic etching process so as to form silicon nitride spacers. During this etching step, the second silicon nitride lines 13 may also be removed. FIG. 6R illustrates an exemplary resulting structure after forming the bitline spacer. Thereafter, the first source/drain portion 52 may be defined by performing an ion implantation step. Capacitor contacts and storage capacitors may be provided on top of the resulting surface of these structures as is common. Then, the memory cell array may be processed in the manner as has been described with reference to FIG. 6N to 6P, for example. A cross-sectional view of the resulting memory cell is illustrated in FIG. 8, for example.

FIG. 7 illustrates a processing sequence for forming the memory cell array according to a further embodiment. A semiconductor substrate may be provided in which a plurality of active area lines are formed, wherein adjacent active area lines 44 are isolated from each other by isolation trenches 41, as illustrated in FIG. 6A. First, a layer 48 of a suitable hardmask material may be deposited. For example, a material such as carbon may be taken. The thickness of the hardmask layer 48 may be approximately more than 50 nm. Moreover, the thickness of this hardmask layer 48 may be less than 100 nm. Thereafter, lines of a first hard mask material such as silicon nitride lines 11 may be formed in the manner which has been described with reference to FIG. 6B. The resulting structure is illustrated in FIG. 7A. For example, the silicon nitride lines 11 may have a width w which corresponds to the minimal structure feature size which may be obtained by the technology employed. The line width w corresponds to the size of the bitline contacts which will be formed in a later processing step. Moreover, the distance between adjacent silicon nitride lines 11 may be 4.0×F. By way of example F may be 100 nm, 90 nm, 80 nm or less than 70 nm, for example 50 nm or 40 nm and, as a further example less than 45 nm.

Figure 7A:
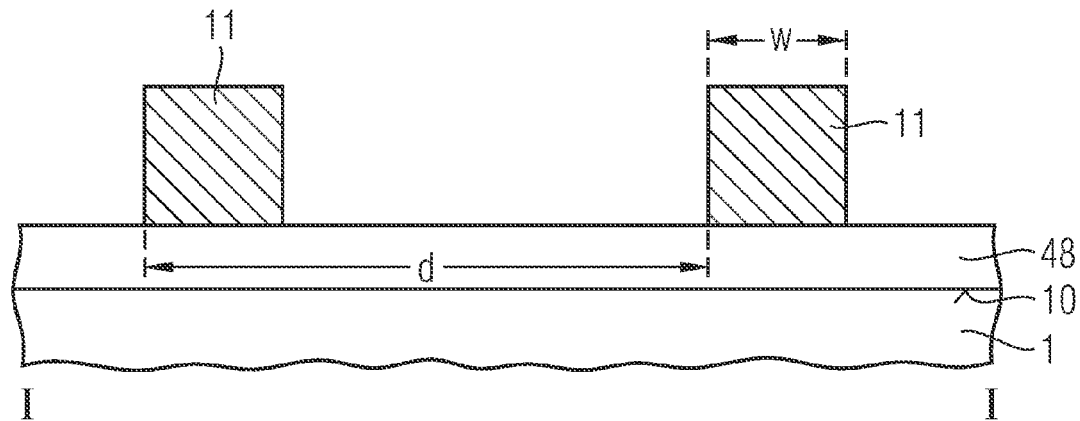
FIGS. 7A to 7H illustrate a method of forming a memory cell array.
Figure 7B:
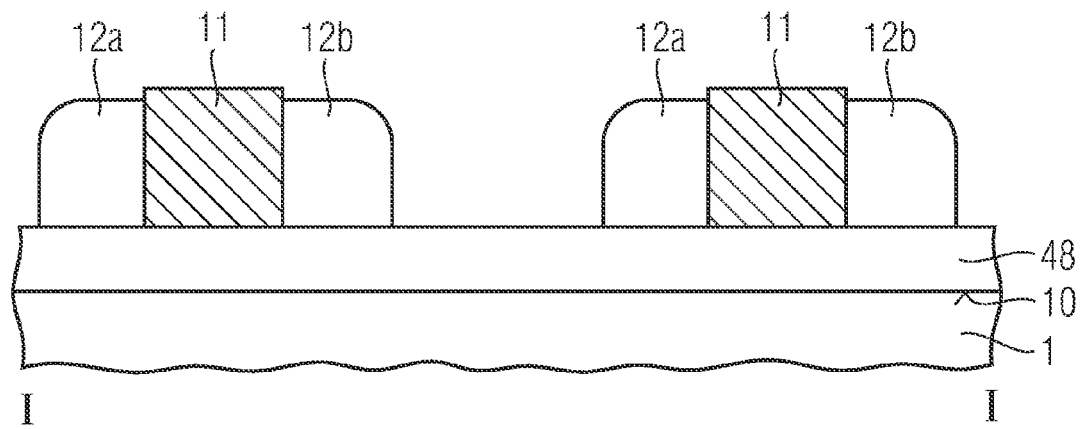
Figure 7C:
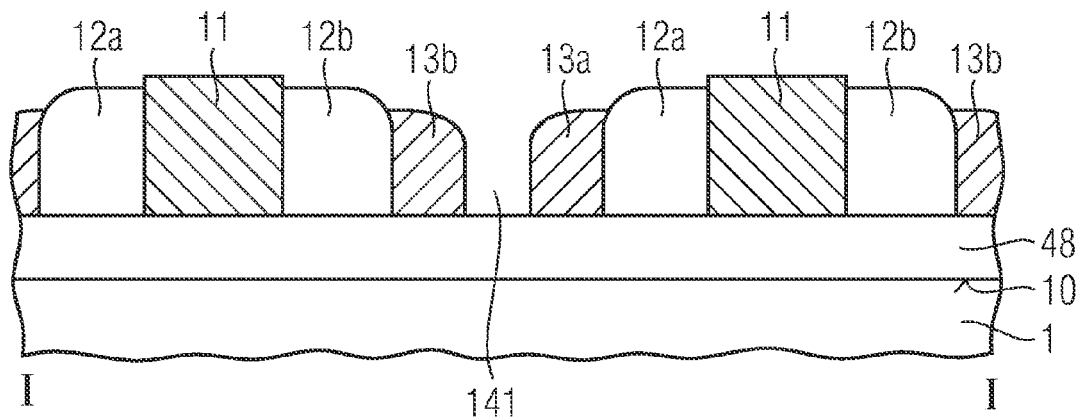

Thereafter, in a similar manner as has been described with reference to FIG. 6C, lines of a sacrificial material, for example, first and second polysilicon lines may be formed adjacent to the silicon nitride lines 11. For example, the first and second polysilicon lines 12a, 12b may be formed by a spacer process which has been explained above. The first polysilicon lines 12a are adjacent to a first side of the silicon nitride lines 11, whereas the second polysilicon lines 12b are adjacent to a second side of the silicon nitride lines 11. The width of each of the polysilicon lines 12a, 12b may correspond to the width of the buried wordlines which are to be formed. Thereafter, in a similar manner as has been described above with respect to FIG. 6D, a further set of lines of a second hardmask material, for example, of silicon nitride lines 13a, 13b are formed by a spacer process. The first silicon nitride lines 13a are adjacent to the first polysilicon lines 12a, whereas the second silicon nitride lines 13b are adjacent to the second polysilicon lines 12b. The width of each of the silicon nitride lines 13a, 13b may correspond to the landing area of the capacitor contacts to be formed. The resulting structure is illustrated in FIG. 7C. As can be seen, on either side of each of the silicon nitride lines 11, a sequence of a polysilicon line 12a, 12b followed by a further silicon nitride line 13a, 13b is formed. Uncovered hardmask portions 141 are disposed between the second silicon nitride lines 13b and the first silicon nitride lines 13a, respectively.

Figure 7D:
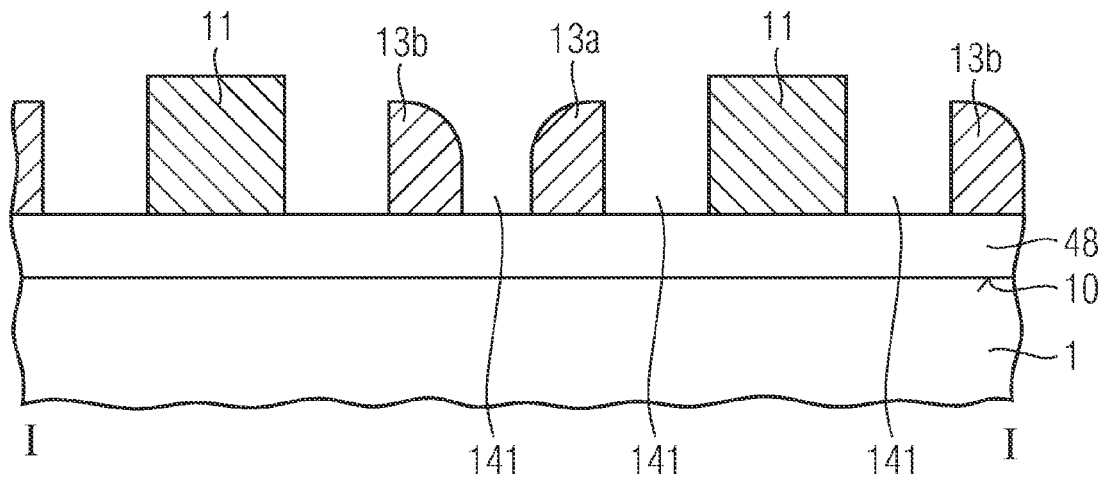
Figure 7E:
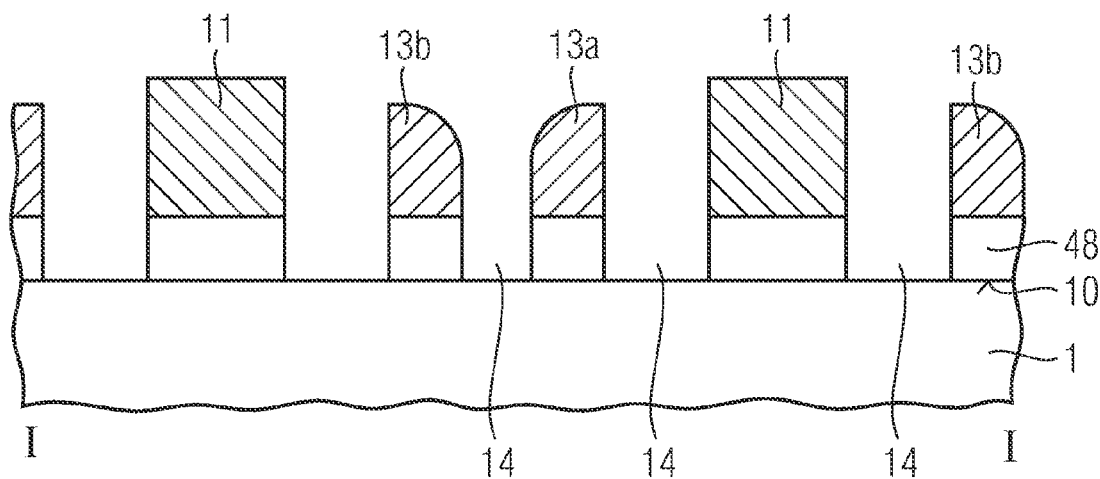
Figure 7F:
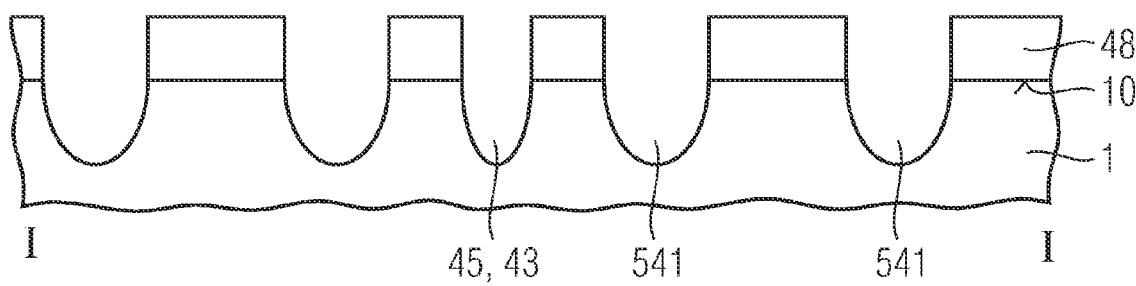
Figure 7G:
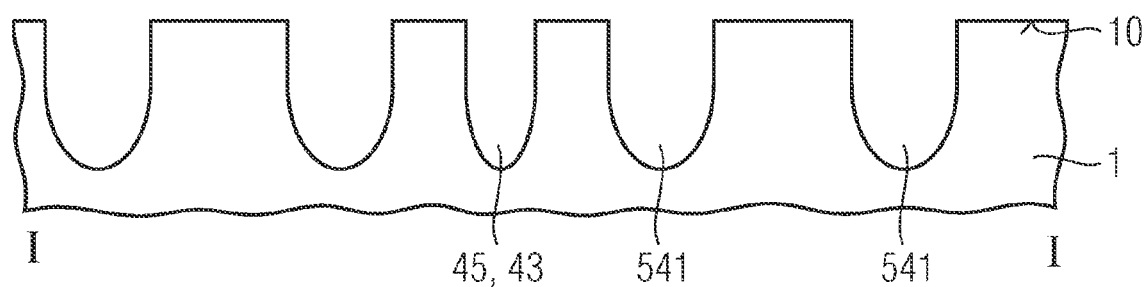
Figure 7H:
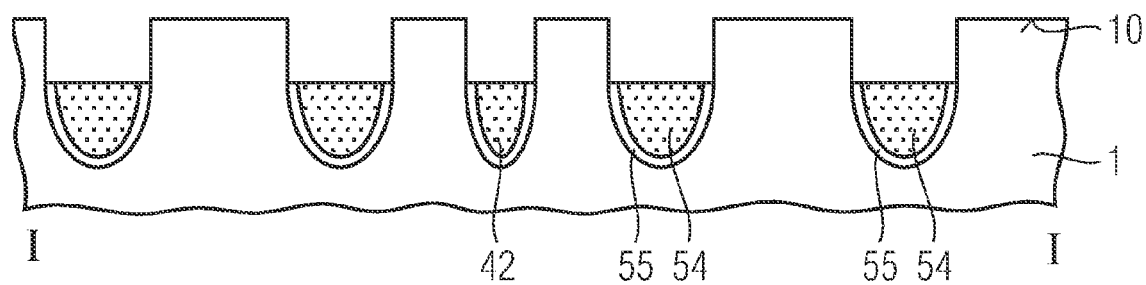

Thereafter, the polysilicon spacers 12a, 12b are removed. For example, this may be accomplished by a selective etching process which etches polysilicon selectively with respect to silicon nitride and the material of the hardmask layer 48. The resulting structure is illustrated in FIG. 7D. Then, the hardmask material 48 is etched. By way of example, this may be accomplished by selectively etching the hardmask material 48 with respect to the silicon nitride lines 11 and the second hardmask material 13. For example, if the hardmask material 48 is carbon, this material may be etched by a plasma etching process using, by way of example, oxygen. As a result, the substrate portions 14 are uncovered. The resulting structure is illustrated in FIG. 7E. Thereafter, the lines 11 as well as the lines 13a, 13b are removed. For example, this may be accomplished by performing a silicon nitride etching step. Then, taking the patterned hardmask layer 48 as an etching mask, gate grooves 541 as well as segmentation trenches 43 or isolation device grooves 45 are etched. By way of example, this may be accomplished by etching silicon and silicon oxide selectively with respect to carbon material. By way of example, the gate grooves 541 may have a width and a depth which is different from the depth and the width of the openings 43, 45, respectively. The resulting structure is illustrated in FIG. 7F. Thereafter, the remaining portions of the hardmask layer 48 are removed by generally known methods. The resulting structure is illustrated in FIG. 7G. Then, the gate grooves 541 as well as the openings 43, 45 are filled with a gate dielectric as well as with a gate material 54. The gate dielectric 55 and the gate material 54 may be those as are commonly used. For example, the gate dielectric 55 may have a thickness of more than 1 nm and less than 5 nm. Then, a recessing process is performed so as to recess the gate material. The resulting structure is illustrated in FIG. 7H. Then, according to one embodiment, the gate material 54 as well as the gate dielectric 55 may be removed from the opening 43, 45. Accordingly, in the manner as has been described above with respect to FIG. 6H, a suitable resist material 47 is applied and patterned so as to uncover the opening 43, 45. Etching processes are performed so as to remove the gate material 54 as well as the gate dielectric 55.

Thereafter, the structure illustrated in FIG. 7H or a similar structure including an insulating material in the segmentation trenches 43 may be further processed. By way of example, an insulating layer may be deposited, followed by a back-etching or CMP process so as to fill the spaces above a gate conductive material 54 and, optionally, the insulating material of the segmentation trenches 43. As a result, gate electrodes formed in the substrate are formed as buried wordlines. Then, the structure may be further processed in a manner, which has been described above with respect to FIG. 6J and as will be described with reference to FIGS. 7C to 7O, for example. A cross-sectional view of the memory cell is illustrated in FIG. 8, for example.

FIG. 8 illustrates a cross-sectional view of the resulting memory cell array. As is illustrated in FIG. 8, in an active area line 44 a plurality of segmented active areas 40 is formed, the segmented active areas being isolated from each other by segmentation trenches 43. An insulating material is filled in the segmentation trenches 43. As has been discussed in detail above, the segmented active areas may as well be isolated by other isolation devices. In each active area 40, two transistors 51 are formed. Each of the transistors 51 includes a first and second source/drain portion 52, 53 as well as a channel which is disposed between the first and the second source/drain portions. The conductivity of the channel 56 is controlled by the gate electrode 54. The gate electrode 54 is disposed in a gate groove 541 which is formed in the substrate surface. To be more precisely, the surface of the gate electrode 54 is disposed beneath the substrate surface 10. An insulating material 19 is disposed above the gate electrode 54. The surface of the insulating material 19 is disposed above the substrate surface 10. The first source/drain portion is connected via a capacitor contact 58 with the first capacitor electrode 76 of a corresponding storage capacitor. Each of the storage capacitors 56 includes a first and second capacitor electrode 76, 77 as well as a capacitor dielectric 78 which is disposed between the first and the second capacitor electrodes 76, 77. When activating a selected memory cell, the gate electrode is addressed by activating a corresponding wordline and a charge stored in the storage capacitor 56 can be read out via the capacitor contact, the first and the second source/drain regions 52, 53 to a corresponding bitline 61. As is illustrated in FIG. 8, the bitlines 61 may be formed so as to be in contact with the substrate surface 10. Accordingly, the second source/drain region 53 may be in direct contact with the bitline 61.

FIG. 9 illustrates a schematic flowchart of a method of manufacturing a memory cell array according to another embodiment. As is illustrated in FIG. 9, first, active area lines are defined in a substrate having a surface (S11). Thereafter, lines of a first hard mask material are provided at positions at which isolation structures are to be formed, the lines of the first hard mask material intersecting the active area lines (S12). Thereafter, bitline contacts are defined in the active areas in a self-aligned manner with respect to the positions of the lines of the first hard mask material, respectively (S15). For example, the bitline contacts may be provided by providing first and second lines of a sacrificial material adjacent to a first and a second side of each of the lines of the first hard mask material, respectively (S13). First and second lines of a second hard mask material are provided adjacent to a first side of the first lines of the sacrificial material and adjacent to a second side of the second lines of the sacrificial material, respectively (S14). As a result, uncovered substrate portions are left between the second and the first lines of the second hard mask material, respectively. The bitline contacts are defined at the positions of the uncovered substrate portions (S15). Optionally, this method may further include removing the lines of the sacrificial material, wherein portions of the substrate surface are exposed and wherein gate openings are defined (S16). Thereafter, the gate electrodes may be provided at the positions of the gate openings, respectively (S17). The method may further include removing the lines of the first hard mask material, thus defining openings for forming the isolation structures (S18). The isolation structures are formed at the positions of the openings for forming the isolation structures (S19). Optionally, the lines of the second hard mask material may be removed, thus defining capacitor contact openings (S20). Moreover, the capacitor contacts may be defined at the positions of the capacitor contacts openings. The method may further include depositing a hardmask layer (S21) after defining the active area lines and before providing the lines of the first hardmask material.

The method according to this embodiment, which is schematically illustrated in FIG. 9, may be performed in a similar manner as has been described above with reference to FIGS. 6 and 7, respectively. To be more specific, the lines of the different materials are provided and a capacitor contact is defined in a self-aligned manner with respect to the lines of the first hard mask material which is disposed at the positions at which the bitline contacts are to be formed. The single processes of providing the respective components of the memory cell array are performed in the same manner as has been described above, but in a different succession. Hence, a repeated description thereof is omitted for the sake of simplicity.

Figure 10A:
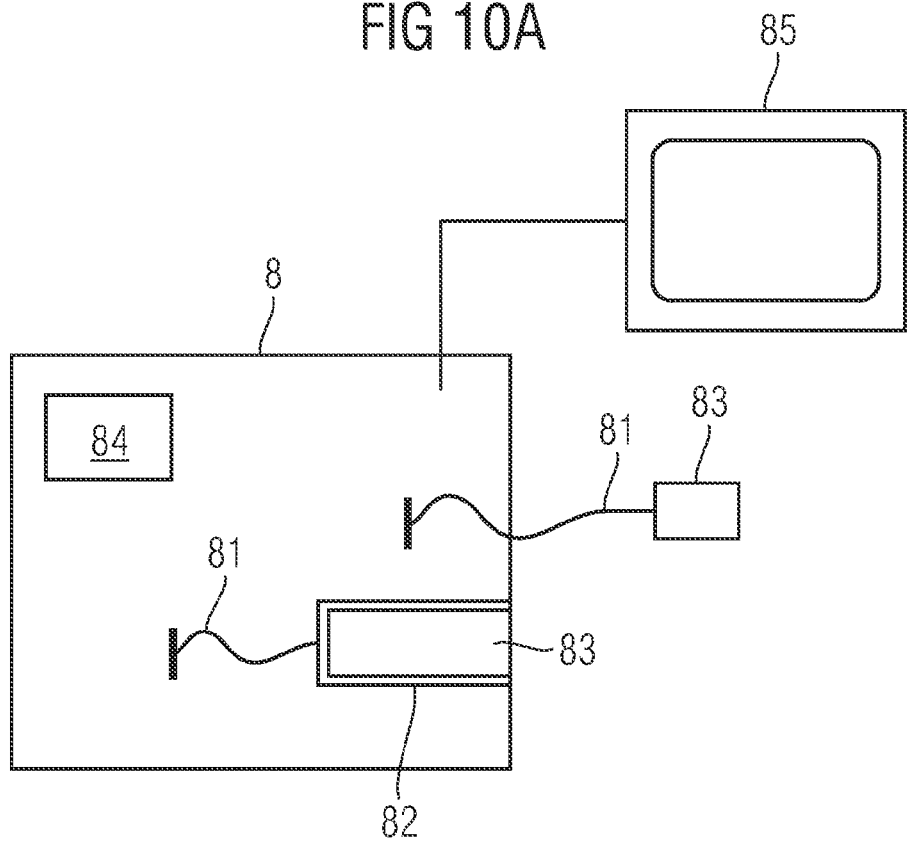
FIGS. 10A and 10B illustrate schematic views of electronic devices according to embodiments, respectively.

FIG. 10A schematically illustrates an electronic device according to one embodiment. As is illustrated in FIG. 10A the electronic device includes an interface 81 and a memory device 83 which is adapted to be interfaced by the interface 81. The memory device includes a memory cell array as has been explained above. By way of example, the memory device 83 may be connected with the interface 81. Nevertheless, as is obvious to the person skilled in the art, any other kind of interface between the electronic device and the memory device 83 may be implemented. For example, the memory device 83 may be housed by the electronic device 8. As a further example, the electronic device 8 may include a slot 82 into which the memory device 83 may be inserted and electrically connected with the interface 81. The electronic device 8 may further include a processing device 84 for processing data. In addition, the electronic device 8 may further include a display 85 for displaying data. The electronic device may further include components which are adapted to implement an electronic system. Examples of the electronic system include a computer, for example, a personal computer or a note book, a server, a router, a game console, for example, a video game console, as a further example, a portable video game console, a graphic card, a personal digital assistant, a digital camera, a cell phone, an audio system such as any kind of music player or a video system. Nevertheless, as is obvious to the person skilled in the art, the electronic system may be exemplified by any other kind of device in which digital data are processed or transmitted or stored.

Figure 10B:
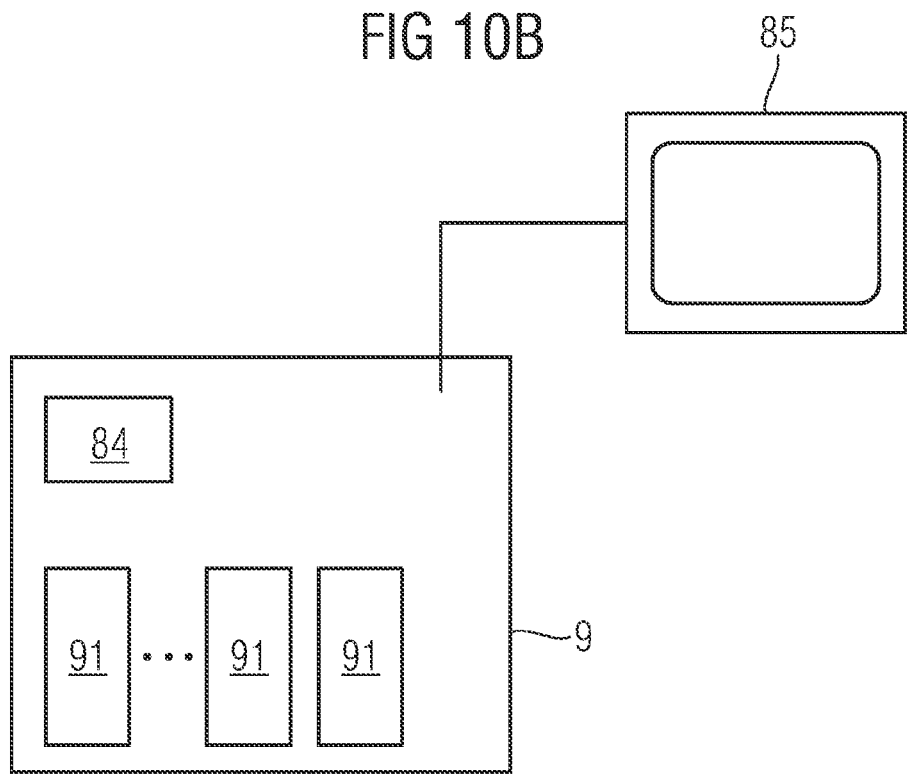

FIG. 10B illustrates a personal computer system 9 according to one embodiment. As is illustrated, the personal computer system 9 includes one or more DRAM components 91, each including a plurality of memory cells. The DRAM components include memory devices as has been explained above. The personal computer system 9 may further include a processing device 84 for processing data and a display 85 for displaying data as well as other components.

Figure 11:
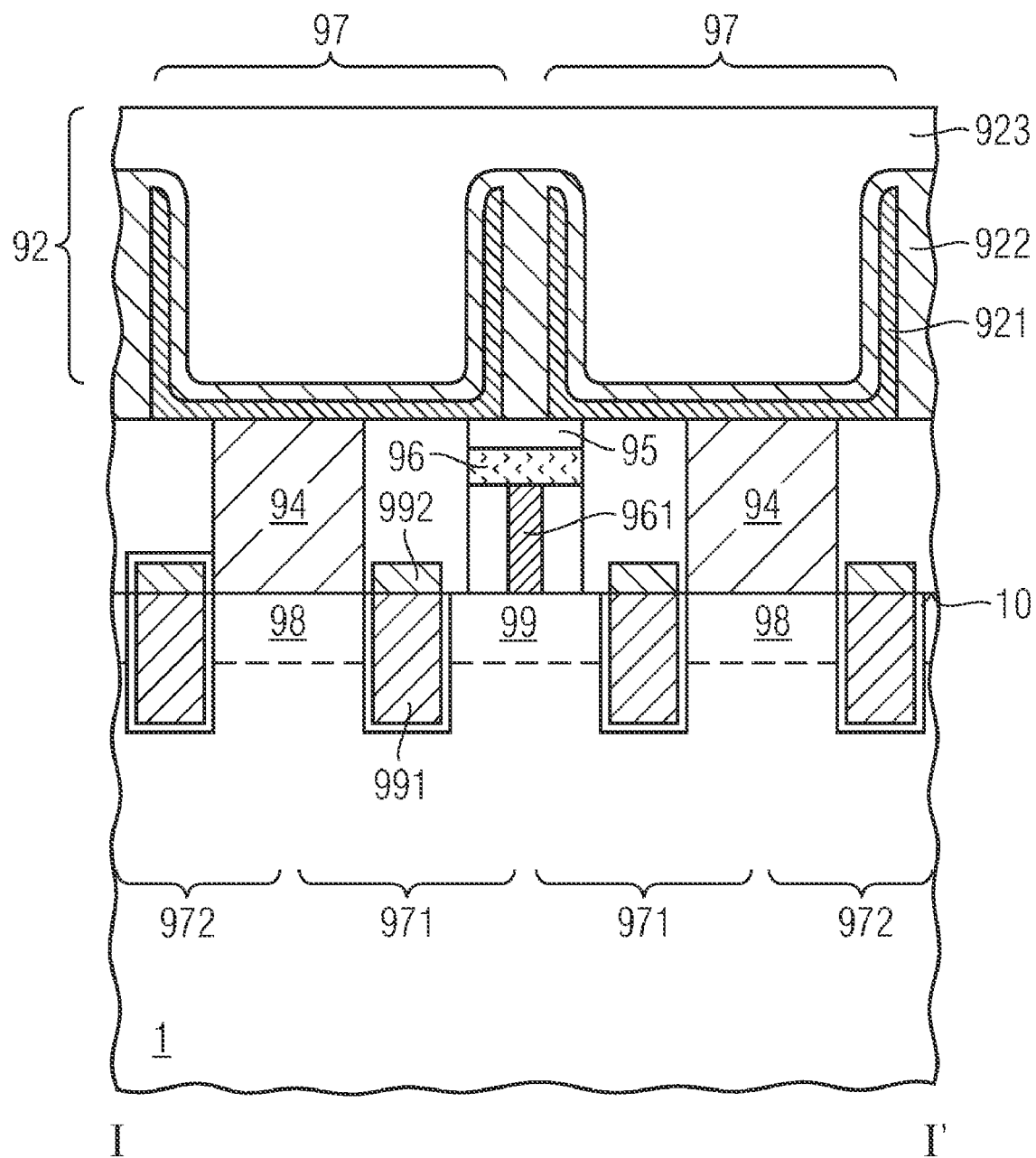
FIG. 11 illustrates a cross-sectional view of a memory cell array according to another embodiment.

Although in the above embodiments, the wordlines have been implemented as buried wordlines and the bitlines have been adjacent to the substrate surface, it is clearly to be understood that the layout which has been explained above may be implemented with any kind of memory cell arrangement. By way of specific example, the bitlines may as well be disposed above the substrate surface so that they are connected with the second source/drain portion of a corresponding transistor via a bitline contact and the wordlines may be disposed above the substrate surface 10. FIG. 11 illustrates an exemplary cross-sectional view of a memory cell which may as well be used in the arrangement as has been described above. Doped portions 98, 99 are formed adjacent to the substrate surface 10. As is illustrated in FIG. 11, the doped portions may be arranged in such a manner, that the first source/drain portions 98 of neighboring transistors 971 are adjacent to each other. The first source/drain portions 98 may be insulated from each other by any kind of isolation device 972 as has been explained above. For example, two neighboring transistors 971 may share a common bitline contact 961. Nevertheless, as is clearly to be understood, any other arrangement may be implemented depending on the specific architecture of the memory device. Each of the memory cells 97 illustrated in FIG. 11 include a storage capacitor 92 and a transistor 971. The transistor 971 includes a first and a second doped portions 98, 99 forming the first and second source/drain portions. The transistor 971 further includes a gate electrode 991, which is insulated from the substrate and configured to control the conductivity of the channel which is formed between the first and second source/drain portions 98, 99. The gate electrode 991 may be implemented in any arbitrary manner. For example, the gate electrode may be completely disposed above the substrate surface 10. Moreover, the gate electrode may form any kind of a FinFET including vertical portions which may extend in active areas or isolation trenches which are disposed before and behind the illustrated plane of the drawing. Moreover, the gate electrode 991 may as well be formed in a groove as has been discussed above. The gate electrode 991 may form part of a corresponding wordline 992. Alternatively, the gate electrodes 991 may be formed as isolated gate electrodes which are connected via a corresponding wordline 992 which is disposed above the substrate surface. The wordline 992 may be disposed above the substrate surface 10. Moreover, the second source/drain portion 99 may be connected via a bitline contact 961 with a corresponding bitline 96. For example, the bitlines 96 may be disposed in the M0 metallization layer, for example, the lowest metallization layer which is present in the memory device. The first source/drain region 98 may be connected via a capacitor contact 94 with a storage electrode 921 of a corresponding storage capacitor 92. The storage capacitor 92 may further include a capacitor dielectric 922 as well as a counter electrode 923. An insulating material 95 is disposed so as to insulate the bitlines 96 from the adjacent storage electrode 921. The arrangement illustrated in FIG. 11 is only by example to illustrate that the various components of the memory device may be implemented in any arbitrary manner.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory cell array comprising:
    memory cells;
    bitlines running along a first direction;
    wordlines running along a second direction substantially perpendicular to the first direction;
    active area segments; and
    bitline contacts, being arranged in columns extending in the second direction and in rows extending in the first direction,
    wherein a distance between neighboring bitlines is dL, and a distance between neighboring bitline contacts is dC, dC being measured parallel to the first direction, wherein $1/2.25 \leq dL/dC \leq 1/1.75$.

2. The integrated circuit of claim 1, comprising wherein two memory cells are formed in each of the active areas segments.

3. The integrated circuit of claim 1, comprising wherein the active area segments form part of active area lines and wherein active area segments which are assigned to common active area lines are insulated from each other by isolation devices.

4. The integrated circuit of claim 3, comprising wherein the isolation device is an isolation field effect transistor.

5. The integrated circuit of claim 3, comprising wherein the isolation device is a segmentation trench filled with a dielectric material.

6. The integrated circuit of claim 3, comprising wherein the active area lines are straight lines.

7. The integrated circuit of claim 3, comprising wherein an angle between the active area lines and the bitlines is approximately 15° to 35°.

8. The integrated circuit of claim 1, comprising wherein each of the bitline contacts is associated with two neighboring transistors that are formed in one active area segment.

9. The integrated circuit of claim 3, comprising wherein neighboring bitline contacts that are connected with active area segments forming part of a common active area line, are connected with neighboring bitlines, respectively.

10. The integrated circuit of claim 4 further comprising isolation gate lines which are connected with isolation gate electrodes forming part of the isolation field effect transistors, the isolation gate lines being arranged between two wordlines.

11. The integrated circuit of claim 4, comprising wherein a width of the gate electrode of the isolation field effect transistor is larger than the width of the gate electrode of a memory cell.

12. The integrated circuit of claim 10, comprising wherein the isolation gate lines are wider than the wordlines.

13. The integrated circuit of claim 1, comprising wherein each of the memory cells includes a FinFET.

14. The integrated circuit of claim 10, comprising wherein two wordlines are followed by one isolation gate line and one isolation gate line is followed by two wordlines.

15. The integrated circuit of claim 10, comprising wherein active areas are formed in a semiconductor substrate having a surface, an upper surface of each of the wordlines and of each of the isolation gate lines being disposed beneath the surface of the semiconductor substrate.

16. The integrated circuit of claim 1, comprising wherein the active areas are formed in a semiconductor substrate having a surface, an upper surface of each of the wordlines being disposed beneath the surface of the semiconductor substrate.

17. The integrated circuit of claim 1, comprising wherein the bitlines are formed as straight bitlines.

18. An electronic device comprising
    an interface; and
    a memory device adapted to be interfaced by the interface, wherein the memory device includes a memory cell array comprising:
    memory cells;
    bitlines running along a first direction;
    wordlines running along a second direction substantially perpendicular to the first direction;
    active area segments; and
    bitline contacts being arranged in columns extending in the second direction and in rows extending in the first direction,
    wherein a distance between neighboring bitlines is dL, and a distance between neighboring bitline contacts is dC, dC being measured parallel to the first direction, wherein $1/2.25 \leq dL/dC \leq 1/1.75$.

19. The electronic device of claim 18, further comprising components adapted to implement an electronic system that is selected from the group consisting of a computer, a server, a router, a game console, a graphics card, a personal digital assistant, a digital camera, a cell phone, an audio system and a video system.

20. A computer system comprising DRAM components, each of the DRAM components comprising:
    memory cells;
    bitlines running along a first direction;

wordlines running along a second direction substantially perpendicular to the first direction;
active area segments; and
bitline contacts being arranged in columns extending in the second direction and in rows extending in the first direction,
wherein a distance between neighboring bitlines is dL, and a distance between neighboring bitline contacts is dC, dC being measured parallel to the first direction, wherein $1/2.25 \leqq dL/dC \leqq 1/1.75$.

* * * * *